United States Patent
Kitagawa et al.

(10) Patent No.: US 8,482,950 B2
(45) Date of Patent: Jul. 9, 2013

(54) NON-VOLATILE SEMICONDUCTOR MEMORY DEVICE THAT CHANGES A LOAD CAPACITANCE OF A SENSE NODE IN ACCORDANCE WITH A LOGIC VALUE OF READ INFORMATION

(75) Inventors: Makoto Kitagawa, Kanagawa (JP); Tsunenori Shiimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 330 days.

(21) Appl. No.: 12/926,118

(22) Filed: Oct. 27, 2010

(65) Prior Publication Data

US 2011/0116296 A1    May 19, 2011

(30) Foreign Application Priority Data

Nov. 16, 2009 (JP) ................................. 2009-261127

(51) Int. Cl.
*G11C 5/02* (2006.01)

(52) U.S. Cl.
USPC .................... 365/51; 365/189.07; 365/189.09; 365/189.05; 365/207

(58) Field of Classification Search
USPC ..................... 365/51, 189.07, 189.09, 189.05, 365/207, 210
See application file for complete search history.

(56) References Cited

U.S. PATENT DOCUMENTS

| | | | |
|---|---|---|---|
| 4,031,524 A * | 6/1977 | Heeren .......................... | 365/104 |
| 6,370,060 B2 * | 4/2002 | Takata et al. ............. | 365/185.21 |
| 6,711,068 B2 * | 3/2004 | Subramanian et al. .. | 365/189.02 |
| 6,795,350 B2 * | 9/2004 | Chen et al. ............... | 365/189.07 |
| 7,239,537 B2 * | 7/2007 | DeBrosse et al. ............. | 365/154 |
| 2002/0004267 A1 * | 1/2002 | Sudo et al. .................... | 438/201 |
| 2003/0197696 A1 * | 10/2003 | Onozawa et al. ............. | 345/212 |

FOREIGN PATENT DOCUMENTS

| | | |
|---|---|---|
| JP | 09-270195 | 10/1997 |
| JP | 10-188576 | 7/1998 |
| JP | 2001-143486 A | 5/2001 |
| JP | 2002-260377 | 9/2002 |
| JP | 2005-51005 | 4/2005 |
| JP | 2009-026364 | 2/2009 |

OTHER PUBLICATIONS

K. Aratani, et al., "A Novel Resistance Memory with High Scalability and Nanosecond Switching," Solid State Memories Research Laboratory, 2007 IEEE, pp. 783-786.
Japanese Office Action issued May 21, 2013 for corresponding Japanese Application No. 2009-261127.

* cited by examiner

*Primary Examiner* — Connie Yoha
(74) *Attorney, Agent, or Firm* — Rader, Fishman & Grauer PLLC

(57) ABSTRACT

A non-volatile semiconductor memory device includes: a memory component in which an electric charge discharging rate between two electrodes is different in accordance with logic of stored information; a sense amplifier that detects the logic of the information by comparing a discharge electric potential of a wiring to which one of the electrodes of the memory component is connected with a reference electric potential; and a load capacitance changing unit that changes load capacitance of a sense node of the sense amplifier to which the discharge electric potential is input or both the load capacitance of the sense node and load capacitance of a reference node of the sense amplifier to which the reference electric potential is input in accordance with the logic of the information read out by the memory component.

18 Claims, 25 Drawing Sheets

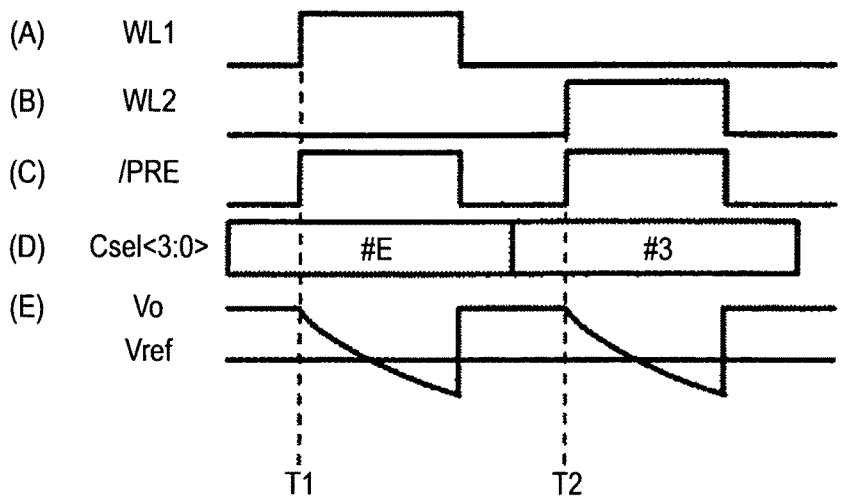
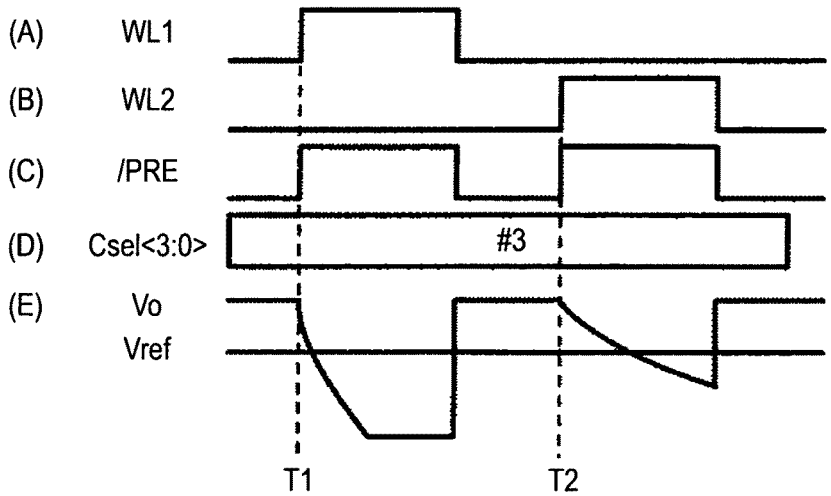
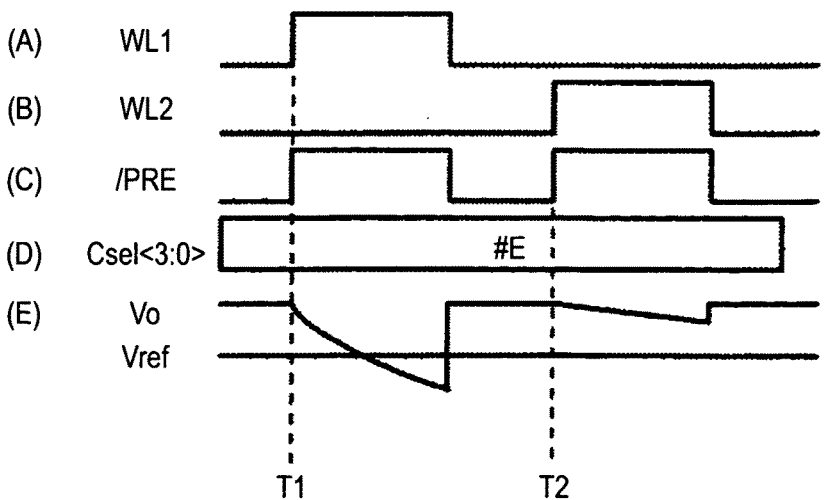

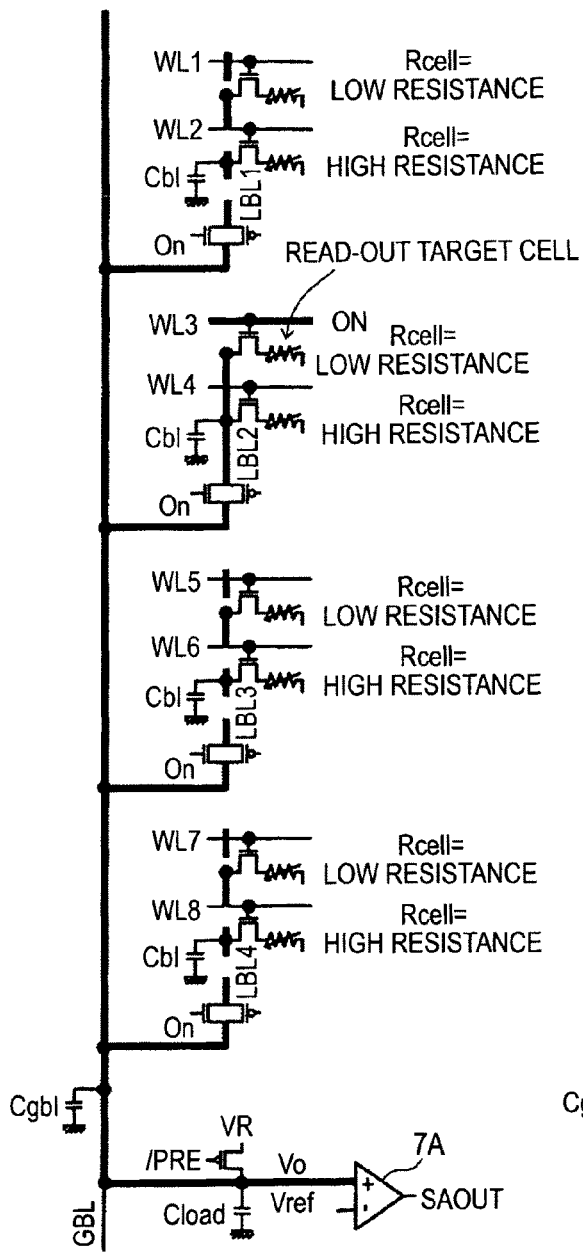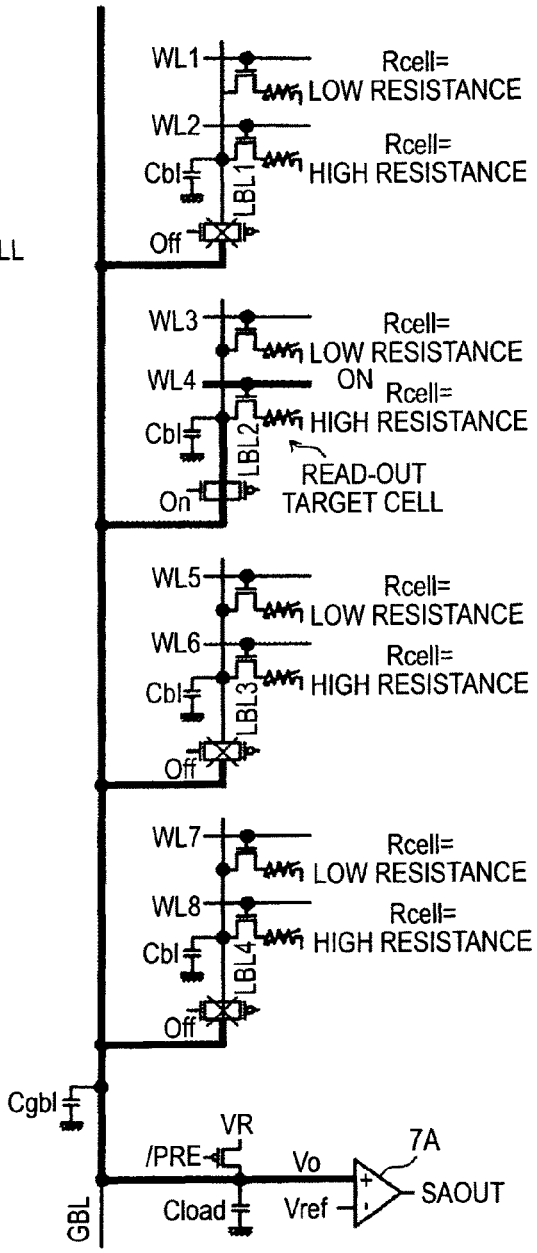
FIG.23A
FIG.23B

NON-VOLATILE SEMICONDUCTOR MEMORY DEVICE THAT CHANGES A LOAD CAPACITANCE OF A SENSE NODE IN ACCORDANCE WITH A LOGIC VALUE OF READ INFORMATION

BACKGROUND OF THE INVENTION

1. Field of the Invention

The present invention relates to a non-volatile semiconductor memory device having a memory device in which an electric charge discharging rate between two electrodes is different in accordance with the logic of stored information.

2. Description of the Related Art

Non-volatile memory devices that read out a difference in the discharge rate by applying a precharge voltage to a bit line are known.

As a representative example of the non-volatile semiconductor memory device to which such a reading method can be applied, there is an (flash) EEPROM.

On the other hand, in order to replace an FG-type (flash) EEPROM, as non-volatile memory devices that can rewrite data at a high speed, variable resistance-type memory devices have attracted attention.

As variable resistance-type memory devices, so-called ReRAMs are known in which a change in the resistance at the time of input/output of conductive ions to/from a conductive film disposed within a memory component is associated with a memory state (for example, see K. Aratani, etc. "A Novel Resistance Memory with High Scalability and Nanosecond Switching", Technical Digest IEDM 2007, pp. 783-786).

In order to assure the reliability of rewriting characteristics, maintaining characteristics, and the like of the ReRAM and in order to apply the ReRAM further to a multiple-valued memory, as in a general flash memory or the like, a method in which a verify•read operation is performed at the time of a write operation or an erase operation is reviewed (for example, see JP-A-2009-26364, JP-A-2002-260377, and JP-A-2005-510005).

In the control of a current that is performed when a verify•read operation of a general flash memory is performed, a reading current (sense current) is approximately constant. Accordingly, by changing the electric potential of the gate of a memory transistor, a different threshold is verified. This operation method has the following merit. According to the operation method, the operating current is constant, and accordingly, the sense timing, the load of the sense node, and the like are hardly dependent upon a threshold to be verified.

SUMMARY OF THE INVENTION

However, according to the ReRAM, there is a limitation, which is different from the flash memory.

The memory component of the ReRAM has only two terminals. In other words, there are only two terminals, through which currents flow, that correspond to the source terminal and the drain terminal of the flash memory, and there is no gate terminal. Here, in a case where a different resistance value is read out at the time of a verify operation, it is assumed that the precharge voltage (=VR) applied to the ReRAM at the time of a read operation is constant, and the resistance (cell resistance) of the memory component of the ReRAM is Rcell. In such a case, the reading current becomes (VR/Rcell). This indicates that the reading current is changed when the cell resistance Rcell is changed.

In the case of the ReRAM, the cell resistance Rcell is different by several digits in accordance with the logic of the stored information. Accordingly, for the above-described reason, in order to perform a verify•read operation at a high speed, control of the sense timing is necessary as described below.

Described in detail, when a verify•read operation is performed by lowering the electric potential (hereinafter, referred to as a BL electric potential) of the bit line in accordance with discharge in the memory component, in a case where the resistance to be sensed is high, the discharge of the BL electric potential at the time of an erase/verify operation is performed at a low speed. Accordingly, it is necessary to delay the sense timing. On the other hand, in a case where the resistance to be sensed is low, the discharge of the BL electric potential at the time of a write•verify operation is performed at a high speed. Accordingly, it is necessary to advance the sense timing. When the sense timing is late at the time of a write•verify operation, the BL electric charges disappear. Therefore, it is difficult to perform a normal sense operation.

As described above, an optimal sense timing differs in accordance with the logic of the information to be read out, which is not limited only to the case of the ReRAM. In other words, when a method in which the magnitude of the cell current is read out by performing dynamic discharge reading without controlling the voltage of the gate of the memory transistor is used, even in a non-volatile memory device such as a flash EEPROM other than the variable resistance-type memory, a lag in the optimal sense timing occurs.

Hereafter, a method of directly reading the discharge rate of the precharged electric charges without regulating the discharge current to be approximately constant (by using the voltage of the gate of the transistor or the like) is referred to as "dynamic discharge reading".

In the case of the dynamic discharge reading, when the optimal sense timing is controlled by a circuit that controls the activation timing of the sense amplifier, the complexity of the control circuit is increased.

Thus, in a non-volatile memory that performs so-called dynamic discharge reading, it is desirable to provide a non-volatile semiconductor memory device capable of performing a read operation at a high speed by correcting a lag in the sense timing.

A non-volatile semiconductor memory device according to an embodiment of the present invention includes: a memory component; a sense amplifier; and a load capacitance changing unit.

The memory component is a component in which an electric charge discharging rate between two electrodes is different in accordance with logic of stored information.

The sense amplifier detects the logic of the information by comparing a discharge electric potential of a wiring to which one of the electrodes of the memory component is connected with a reference electric potential.

The load capacitance changing unit changes load capacitance of a sense node of the sense amplifier to which the discharge electric potential is input or both the load capacitance of the sense node and load capacitance of a reference node of the sense amplifier to which the reference electric potential is input in accordance with the logic of the information read out by the memory component.

According to the above-described configuration, the load capacitance changing unit changes one or both of the load capacitance of the sense node and load capacitance of the reference node of the sense amplifier in accordance with the logic of the information read out by the memory component. An ordinary read operation in which the logic of the read-out information is arbitrary ("1" or "0"), a write•verify read operation in which, for example, the logic of the read-out information is "1", and an erase/verify read operation in which, for example, the logic of the read-out information is "0" will be described as an example. In these three types of read operation, the optimal values of the sense timings are different from each other. For example, in the case of the ReRAM as an example, the resistance value of the memory component is lowest at the time of the write•verify operation, the resistance value thereof is highest at the time of the erase/verify operation, and the resistance value is a middle value thereof at the time of the ordinary read operation. Accordingly, in reading such different resistance values, the optimal load capacitance is determined by the load capacitance changing unit in accordance with the logic (a difference between "1" and "0") of the information.

Thus, by performing these three types of the read operations, the discharge rate can be approximately uniformized. Therefore, the sense timing of the sense amplifier can be uniformized to an approximate constant.

According to the embodiment of the present invention, in the non-volatile memory that performs so-called dynamic discharge reading, the non-volatile semiconductor memory device capable of performing a read operation at a high speed by correcting the mismatch of the sense timing can be provided.

BRIEF DESCRIPTION OF THE DRAWINGS

FIG. 10 shows operation waveform diagrams according to the first embodiment.

FIG. 11 shows operation waveform diagrams of a comparative example.

FIG. 12 shows operation waveform diagrams of another comparative example.

FIGS. 23A and 23B are diagrams illustrating the operation of the circuit shown in FIG. 22.

DESCRIPTION OF THE PREFERRED EMBODIMENTS

Embodiments of the present invention will be described with an ReRAM used as an example in the following order.

1. First Embodiment: Basic Embodiment of Memory Having Single-End Type Sense Amplifier 2. First Modified Example: Example of Device Change of BLI Switch 3. Second Embodiment: Embodiment in Which Charge Transition-Type Discharge Is Performed As Memory Having Single End-Type Sense Amplifier 4. Third Embodiment: Memory Having Single End-Type Sense Amplifier in Which Additional Capacitor Is Used as Wiring Load of Unused BL 5. Fourth Embodiment: Embodiment, in Which Additional Capacitor Is Used As Wiring Load of Unused LBL, Having Bit Line-Layered Structure of Memory Having Single End-Type Sense Amplifier 6. Comparative Example: Comparative Examples for Fifth Embodiment And Embodiments Thereafter And Disadvantages Thereof 7. Fifth Embodiment: Embodiment Including Case in Which Additional Capacitors Are Connected to Both Sense Node Side and Reference Node Side of Differential Sense Amplifier 8. Sixth Embodiment: Embodiment in Which Additional Capacitor Disposed on Sense Node Side of Differential Sense Amplifier Is Adjusted 9. Seventh Embodiment: Embodiment Using Bit Line-Layered Structure of Memory of Differential Sense Amplifier In a non-volatile semiconductor memory device according to an embodiment of the present invention, the load capacitance (sense-side load capacitance) of a sense node of a sense amplifier or both the sense-side load capacitance and reference load capacitance of a reference node can be changed by a load capacitance changing unit. Hereinafter, ReRAMs according to the embodiments will be described with a case where the load capacitance of the sense node is changed used as a main example, and a case where both the sense-side load capacitance and the reference-side load capacitance can be changed will be described in the embodiments.

<1. First Embodiment>

[Configuration of Memory Cell]

Figure 1A:
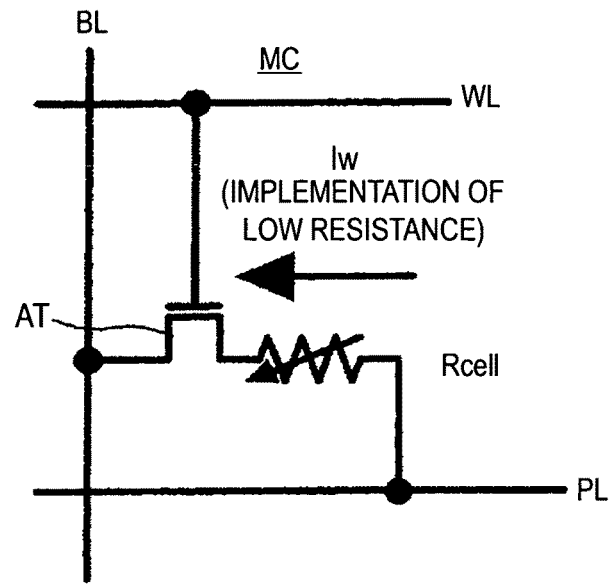
FIGS. 1A and 1B are equivalent circuit diagrams of a memory cell that is common to the first to sixth embodiments and modified examples.
Figure 1B:
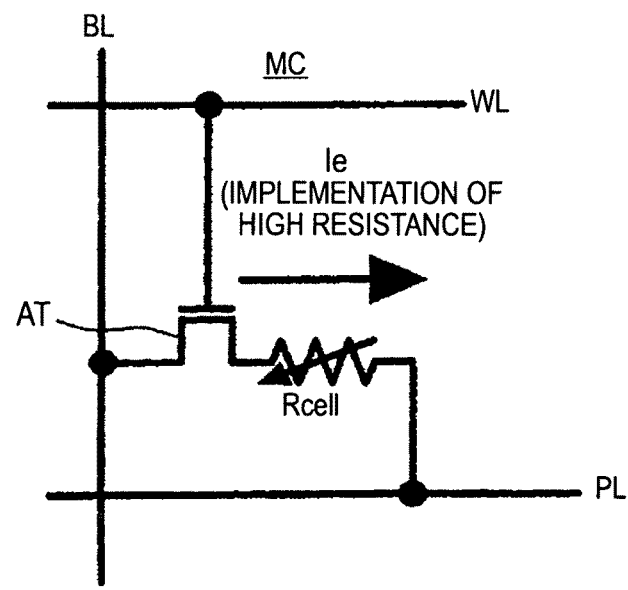

FIGS. 1A and 1B represent an equivalent circuit of a memory cell that is common to the embodiments of the present invention. FIGS. 1A and 1B represent the direction of a write current Iw and the direction of an erase current Ie. However, the configurations of the memory cells are the same in the figures.

A memory cell MC illustrated in FIGS. 1A and 1B has one memory cell resistor Rcell serving as a "memory component" and one access transistor AT.

One end of the memory cell resistor Rcell is connected to a plate line PL, and the other end thereof is connected to the source of the access transistor AT. In addition, the drain of the access transistor AT is connected to a bit line BL, and the gate thereof is connected to a word line WL serving as an "access line".

In FIGS. 1A and 1B, the bit line BL and the plate line PL are represented to be orthogonal to each other. However, the bit line BL and the plate line PL may be disposed to be parallel to each other.

Figure 2:
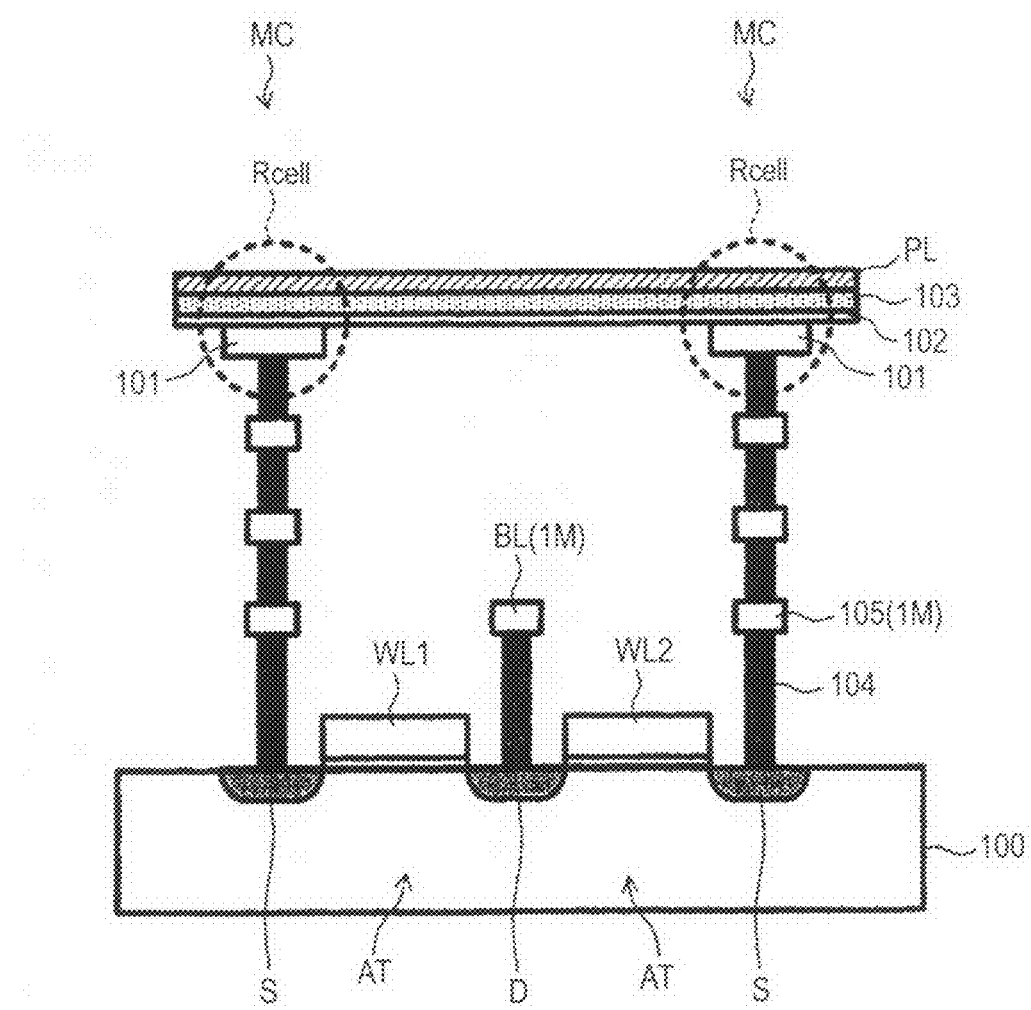
FIG. 2 is a cross-sectional view showing the structure of two adjacent memory cell portions of a device.

FIG. 2 represents the device structure of a portion corresponding to two adjacent memory cells MC. FIG. 2 is a schematic cross-sectional view, and hatched lines are not attached. A blank portion of FIG. 2, which is not particularly mentioned, is filled with an insulating film or configures another portion (a part thereof).

In each memory cell MC illustrated in FIG. 2, the access transistor AT is formed in a semiconductor substrate 100.

Described in detail, two impurity regions that become the source (S) and the drain (D) of the access transistor AT are formed in the semiconductor substrate 100, and a gate electrode formed from polysilicon or the like is formed through a gate insulating film on a substrate area disposed therebetween. Here, the gate electrode configures a word line WL1 or WL2.

The drain (D) is shared by the two memory cells MC and is connected to the bit line BL formed by a first wiring layer (1M).

On the source (S), a plug 104 and a landing pad 105 (formed from the wiring layer) are repeatedly stacked, and a memory cell resistor Rcell is formed thereon. The memory cell resistor Rcell may be formed in any layer of the multiple-layer wiring structure. Here, the cell resistor Rcell is formed mostly on the fourth to fifth layers.

The memory cell Rcell has a film configuration (laminated structure) having an insulating film 102 and a conductive film 103 between a lower electrode 101 and an upper electrode that becomes the plate line PL.

As examples of the material of the insulating film 102, there are SiN, SiO2, Gd2O3, and the like.

As examples of the material of the conductive film 103, there are a metal film, an alloy film (for example, a CuTe alloy film), a metallic compound film, or the like that contains one or more metal elements selected from among Cu, Ag, and Zr. In addition, a metal element other than Cu, Ag, and Zr may be used as long as it has an easily-ionizable property. In addition, it is preferable that an element that is combined with at least one of Cu, Ag, and Zr is at least one of S, Se, and Te. The conductive film 103 is formed as an "ion supplying layer".

Figure 3A:
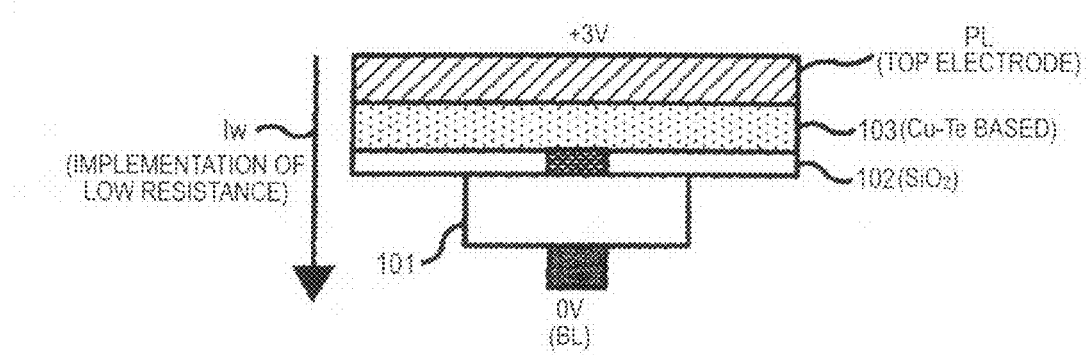
FIGS. 3A and 3B are diagrams representing a cross section and the operation of a variable cell resistor (memory component).
Figure 3B:
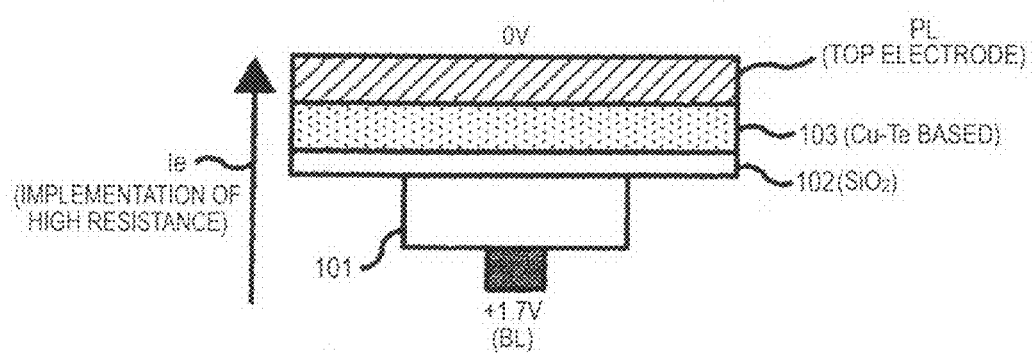

FIGS. 3A and 3B show enlarged views of the memory cell resistor Rcell to which examples of the direction of a current and applied voltage values are added.

FIGS. 3A and 3B show a case where the insulating film 102 is formed from SiO2, and the conductive film 103 is formed from a CuTe alloy-based alloy compound (Cu—Te based) as an example.

As shown in FIG. 3A, a voltage having the insulating film 102 side as a cathode side and the conductive film 103 side as a positive side is applied between the lower electrode 101 and the upper electrode (the plate line PL). For example, the bit line BL is grounded as being 0 [V], and for example, +3 [V] is applied to the plate line PL.

Then, Cu, Ag, or Zr that is contained in the conductive film 103 is ionized so as have a property of being drawn to the cathode side. Conductive ions of the metal are injected into the insulating film 102. Accordingly, the insulating property of the insulating film 102 is degraded, and comes to have conductivity in accordance with the degradation. As a result, a write current Iw flows in the direction shown in FIG. 3A. This operation is referred to as write (operation) or set (operation).

In contrast to this case, as shown in FIG. 3B, a voltage having the insulating film 102 side as a positive side and the conductive film 103 side as a negative side is applied between the lower electrode 101 and the upper electrode (the plate line PL). For example, the plate line PL is grounded as being 0 [V], and for example, +1.7 [V] is applied to the bit line BL.

Then, the conductive ions injected into the insulating film 102 are returned back to the conductive film 103 so as to be reset to the state before the write in which the resistance value is high. This operation is referred to as erase (operation) or reset (operation). In the reset state, an erase current Ie flows in the direction shown in FIG. 3B.

Hereinafter, setting represents "sufficiently injecting the conductive ions into the insulating film", and resetting represents "sufficiently extracting the conductive ions from the insulating film".

On the other hand, the state (set or reset) of being a write state of data and the state of being an erase state of data are arbitrarily defined.

In the description below, a case where the insulating property of the insulating film 102 is degraded, and the resistance value of the entire memory cell resistor Rcell decreases up to a sufficient level corresponds to "write" (set) of data. In contrast, a case where the insulating property of the insulating film 102 is returned back to the original initial state, and the resistance value of the entire memory cell resistor Rcell increases up to a sufficient level corresponds to "erase" (reset) of data.

Here, the direction of an arrow included in the circuit symbol of the memory cell resistor Rcell shown in FIGS. 1A and 1B, generally, is the same as that of the current at the time of setting (here, at the time of writing).

By repeating the setting and the resetting that are described above, a binary memory that reversibly changes the resistance value of the memory cell resistor Rcell between a high resistance state and a low resistance state is implemented. In addition, the memory cell resistor Rcell maintains data even when application of a voltage is stopped, whereby serving as a non-volatile memory.

At the time of setting, actually, the resistance value of the insulating film 102 changes in accordance with the amount of the metal ions included in the insulating film 102. Accordingly, the insulating film 102 can be regarded as a "memory layer" in which data is stored and maintained.

By configuring a memory cell by using the memory cell resistor Rcell and disposing a plurality of the memory cells, a memory cell array of a variable resistance-type memory can be configured. The variable resistance-type memory is configured by the memory cell array and a driving circuit (peripheral circuit).

[Configuration of IC Chip]

Figure 4:
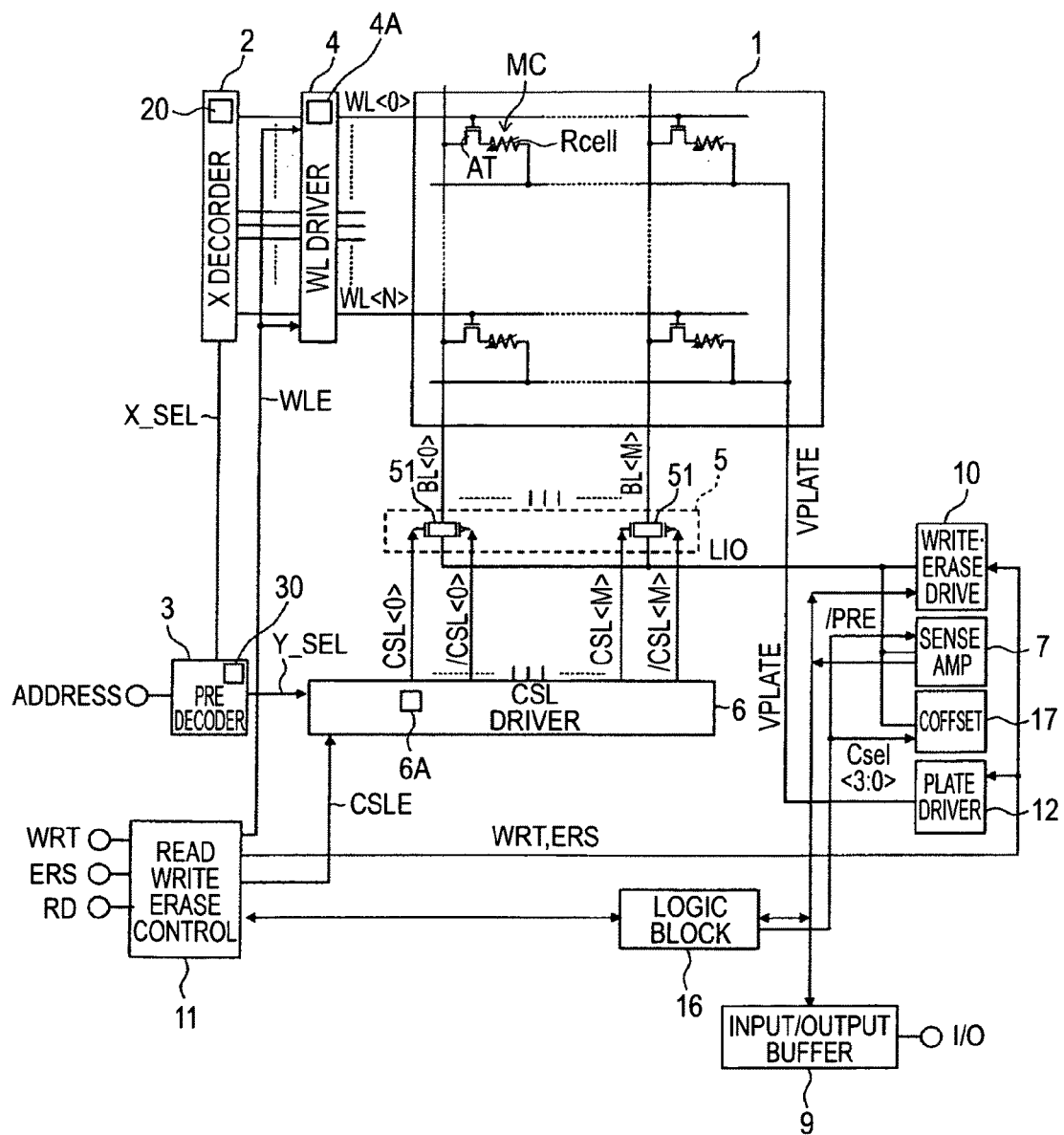
FIG. 4 is a block diagram of an IC chip (memory device) that is common to the first to sixth embodiments.

FIG. 4 shows a block diagram of an IC chip. The illustrated semiconductor memory device has a memory cell array 1 in which (M+1) memory cells MC shown in FIGS. 1A to 3B are disposed in the row direction, and (N+1) memory cells MC are disposed in the column direction, so as to form a matrix pattern. The semiconductor memory device is configured by integrating the memory cell array 1 and the peripheral circuit thereof in the same semiconductor chip. Here, "N" and "M" are natural numbers that are relatively large, and concrete values thereof are arbitrarily set.

In the memory cell array 1, (N+1) word lines WL<0> to WL<N> that connect in common the (M+1) memory cells MC aligned in the row direction and the gates of access transistors AT are disposed at a predetermined interval in the column direction. In addition, (M+1) bit lines BL<0> to BL<M> that connect in common the (N+1) memory cells MC aligned in the column direction and the drains of the access transistors AT are disposed at a predetermined interval in the row direction.

In addition, (N+1) plate lines PL that connect in common the access transistors AT of the memory cell resistors Rcell and nodes disposed on the opposite sides thereof in the row direction are disposed at a predetermined interval in the column direction. One ends of the (N+1) plate lines PL are configured to be common and appear on the outside of the memory cell array 1. Alternatively, (M+1) plate lines PL may be longitudinally disposed in the column direction.

The peripheral circuit, as shown in FIG. 4, includes an X (address) decoder (X decoder) 2, a pre-decoder (PRE Decoder) 3 that also serves as a Y (address) decoder, a WL driver 4, a BLI switch 5, and a CSW driver 6. In addition, the peripheral circuit includes a sense amplifier (Sense Amp) 7 and an I/O buffer (Input/Output Buffer) 9 for each column. Furthermore, the peripheral circuit includes a write•erase driver (Write•Erase Driver) 10, a control circuit 11, a plate driver (PLATE Driver) 12, a logic block 16, and an offset capacitance adding circuit 17. A circuit that generates various voltages based on a power source voltage, a clock signal generating control circuit, and the like are not shown in FIG. 4. Here, the offset capacitance adding circuit 17, the control circuit 11 used for controlling the offset capacitance adding circuit 17, a switch that controls the connection between the offset capacitance adding circuit 17 and the memory cell array by switching power of these circuits, and the like correspond to a "load capacitance shifting unit" according to an embodiment of the present invention. At least a part of the offset capacitance adding circuit 17, particularly, an additional capacitance portion, a connection switch thereof, and the like may be disposed inside the memory cell array 1.

The X decoder 2 is configured by using an X selector (not shown in the figure) as its basic unit. The X decoder 2 is a circuit that decodes an X address signal input from the pre-decoder 3 and transmits an X select signal X_SEL selected based on the decoding result to the WL driver 4. The X selector will be described later in detail.

The pre-decoder 3 divides the input address signal (Address) into an X address signal and a Y address signal. The pre-decoder 3 transmits the X address signal X_SEL to the X decoder 2 and decodes the Y address signal by using a Y decoding unit. The Y decoding unit of the pre-decoder 3 is configured by a Y selector (not shown in the figure) as its basic unit. The pre-decoder 3 is a circuit that decodes the input Y address signal and a Y select signal Y_SEL selected based on the decoding result to the CSW driver 6. The Y selector will be described later in detail.

The WL driver 4 includes (N+1) WL driver units (not shown in the figure) for the word lines WL. To the output of each WL driver unit, one corresponding word line amongst the (N+1) word lines WL<0> to WL<N> is connected. One WL driver unit is selected in accordance with the X select signal X_SEL that is input from the X decoder 2. The WL driver unit is a circuit that applies a predetermined voltage to the word line WL connected to the output thereof when being selected. The WL driver unit will be described later in detail.

The CSW driver 6 is configured by a CSW driver unit as its basic unit. The CSW driver 6 is a circuit that drives column selection lines CSL<0> to CSL<M> as wirings used for controlling the BLI switch 5. The CSW driver unit will be described later in detail.

The BLI switch 5, for example, is a single NMOS transistor (or a PMOS transistor) or a set of the switches 51 configured by transfer gates shown in FIG. 4. Here, there are a total of (M+1) switches 51 each connected to a respective bit line BL. Here, each switch configuring the BLI switch 5 is assumed to be a transfer gate.

The write•erase driver 10 is connected to the I/O buffer 9. The write•erase driver 10 receives data, which is transmitted from the outside, from the I/O buffer 9 as input and controls the sense amplifier 7 such that the data maintained in the sense amplifier 7 can be changed in accordance with the input data.

The output node of the sense amplifier 7 is connected to the I/O buffer 9. The sense amplifier 7 compares a change in the electric potential of the bit line BL, which is input through the switch 51 that is in the ON state, with a reference electric potential.

The control circuit 11 receives a write enable signal WRT, an erase enable signal ERS, and a data read signal RD as input and operates based on the three signals. The control circuit 11 has the following five functions.

(1) a function of controlling word lines by providing each WL driver unit disposed inside the WL driver 4 with a WL selection enable signal WLE (2) a function of individually allowing the switches 51 to be conductive or non-conductive by controlling the CSW driver 6 through the pre-decoder 3 (or directly)

(3) a function of controlling supply of an operation voltage by providing the write•erase driver 10 with a write enable signal WRT or an erase enable signal ERS at the time of writing or erasing data (4) a function of controlling supply of an operation voltage by providing the plate driver 12 with a write enable signal WRT or an erase enable signal ERS as is necessary at the time of writing or erasing data (5) a function of setting initial data of inhibit control by controlling the logic block 16 at the time of a verify operation Only reference signs of various control signals that are output by the control circuit 11 are shown in FIG. 4, and detailed changes in the level will be described later.

[Control System Circuit]

Next, the X selector that is a basic configuration of the X decoder 2 and the Y selector that is a basic configuration of the Y decoder function of the pre-decoder 3 will be described. Subsequently, the WL driver unit that is a basic configuration of the WL driver 4 will be described.

Figure 5:
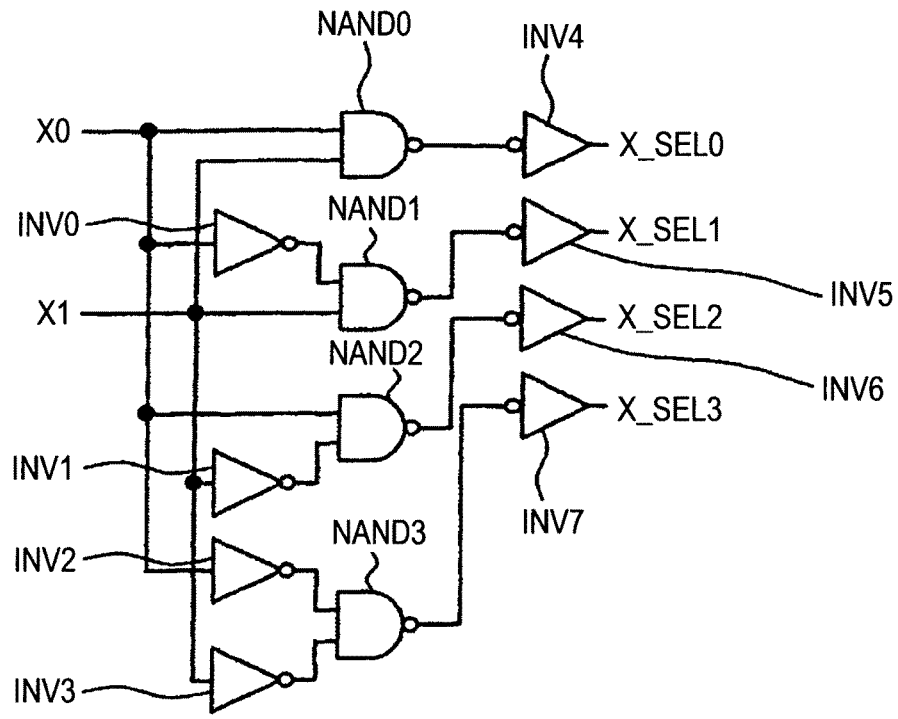
FIG. 5 is a circuit diagram of an X selector.

FIG. 5 shows an example of the circuit of the X selector 20. The X selector 20 illustrated in FIG. 5 is configured by four inverters INV0 to INV3 disposed on the former stage, four NAND circuits NAND0 to NAND3 disposed on the intermediate stage, and other four inverters INV4 to INV7 connected on the latter stage. The X selector 20 is a circuit that receives X address bits X0 and X1 as input and activates (for example, sets a high level to) any one of X select signals X_SEL0 to X-SEL3 in accordance with the decoding result. FIG. 5 is an example of two-bit decoding. However, the X decoder 2 can be implemented so as to respond to an input of bits other than two bits by expanding or developing into multiple stages the configuration shown in FIG. 5 in accordance with the number of bits of the input X address signal.

Figure 6:
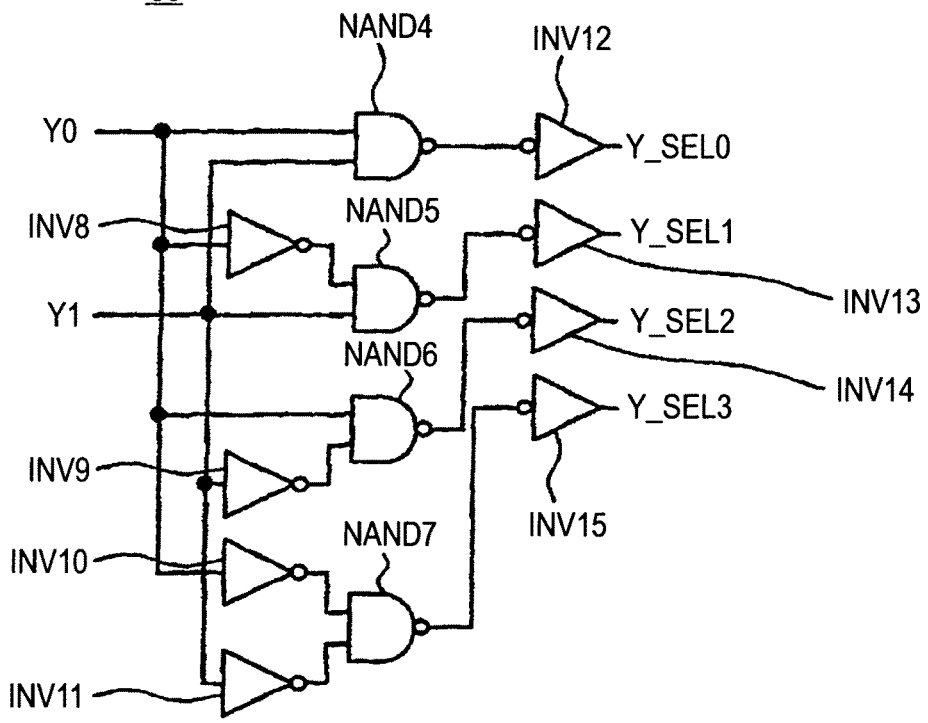
FIG. 6 is a circuit diagram of a Y selector.

FIG. 6 shows an example of the circuit of the Y selector 30. The illustrated Y selector 30 is configured by four inverters INV8 to INV11 disposed on the former stage, four NAND circuits NAND4 to NAND7 disposed on the intermediate stage, and other four inverters INV12 to INV15 connected on the latter stage. The Y selector 30 is a circuit that receives Y address bits Y0 and Y1 as input and activates (for example, sets a high level to) any one of Y select signals Y_SEL0 to Y-SEL3 in accordance with the decoding result. FIG. 6 is an example of two-bit decoding. However, the pre-decoder 3 can be implemented so as to respond to an input of bits other than two bits by expanding or developing into multiple stages the configuration shown in FIG. 6 in accordance with the number of bits of the input Y address signal.

Figure 7:
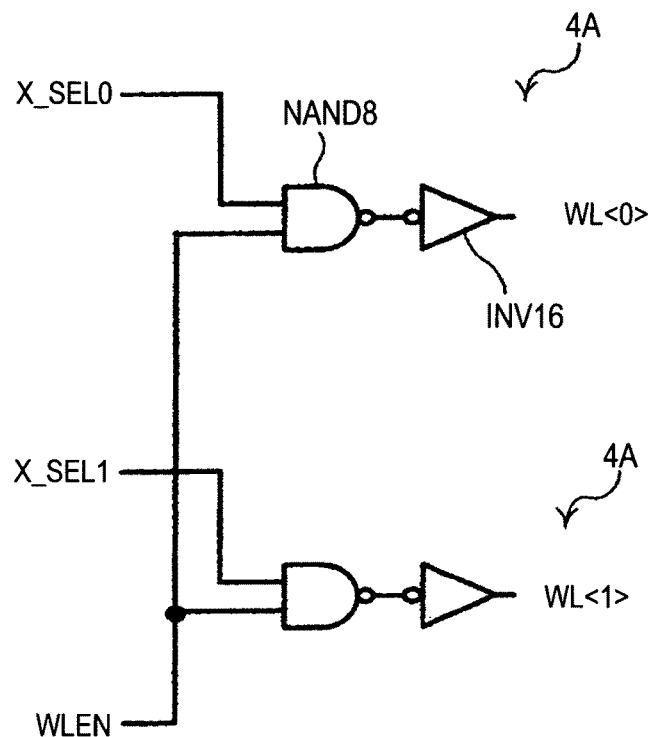
FIG. 7 is a circuit diagram showing two WL driver units.

FIG. 7 is a circuit diagram showing two WL driver units 4A. The number of the illustrated WL driver units 4A that are disposed is the same as the number (N+1) of cells disposed inside the WL driver 4 in the column direction. These (N+1) WL driver units 4A operate in accordance with one X select signal X_SEL0 or X_SEL1 that is selected (activated) by the X selector 20 shown in FIG. 5 or the like. The WL driver unit 4A activates one of the word lines WL<0> and WL<1> according to the X select signal X_SEL0 or X_SEL1.

The WL driver unit 4A illustrated in FIG. 7 is configured by a NAND circuit NAND8 and an inverter INV16. The WL selection enable signal WLE is input to one input of the NAND circuit NAND8, and the X select signal X_SEL0 or X_SEL1 is input to the other input thereof. In addition, the output of the NAND circuit NAND8 is connected to the input of the inverter INV16. The word line WL<0> or WL<1> that is connected to the output of the inverter INV16 is activated or inactivated.

The WL selection enable signal WLE shown in FIG. 7 is generated by the control circuit 11 shown in FIG. 4 and is supplied to the row decoder 4.

Figure 8:
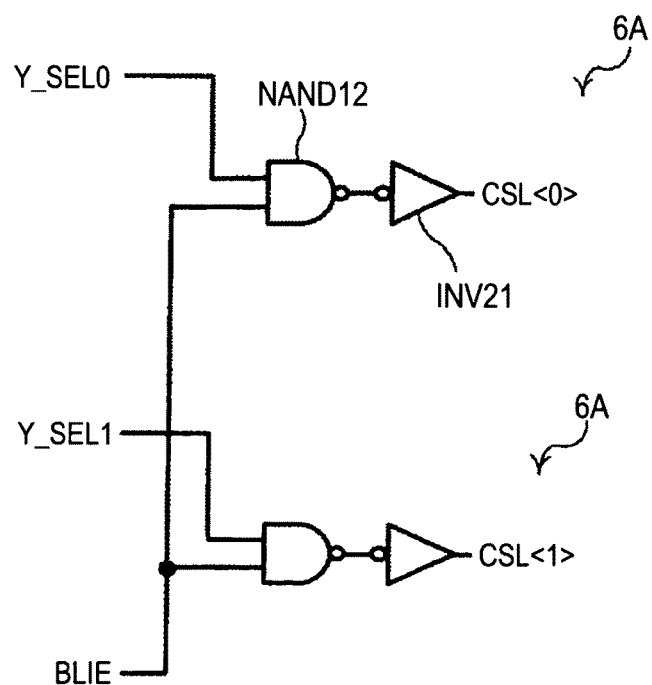
FIG. 8 is a circuit diagram of a CSW driver unit.

FIG. 8 shows an example of a circuit corresponding to two CSL driver units 6A. The illustrated CSL driver unit 6A is configured by a NAND circuit NAND12 and an inverter INV21 that is connected to the output thereof. A BLI enable signal BLIE is input to one input of the NAND circuit NAND12, and one Y select signal Y_SEL0 or Y_SEL1 that is selected (activated) by the Y selector 30 shown in FIG. 6 is input to the other input thereof. When the Y select signal Y_SEL0 or Y_SEL1 and the BLI enable signal BLIE are activated (set to a high level) together, the output of the NAND circuit NAND12 is in a low, level. Accordingly, the electric potential of the column selection line CSL<0> or CSL<1> that is connected to the output of the inverter INV21 transits to an activated level (in this example, a high level). The electric potential of the column selection line CSL<0> or CSL<1>, as shown in FIG. 4, is connected to the gate of the corresponding NMOS transistor 72.

The BLI enable signal BLIE shown in FIG. 8 is generated by the control circuit 11 shown in FIG. 4 and is supplied to the CSW driver 6.

[Configuration of Column Circuit and Configuration for Adding Offset Capacitance]

Figure 9:
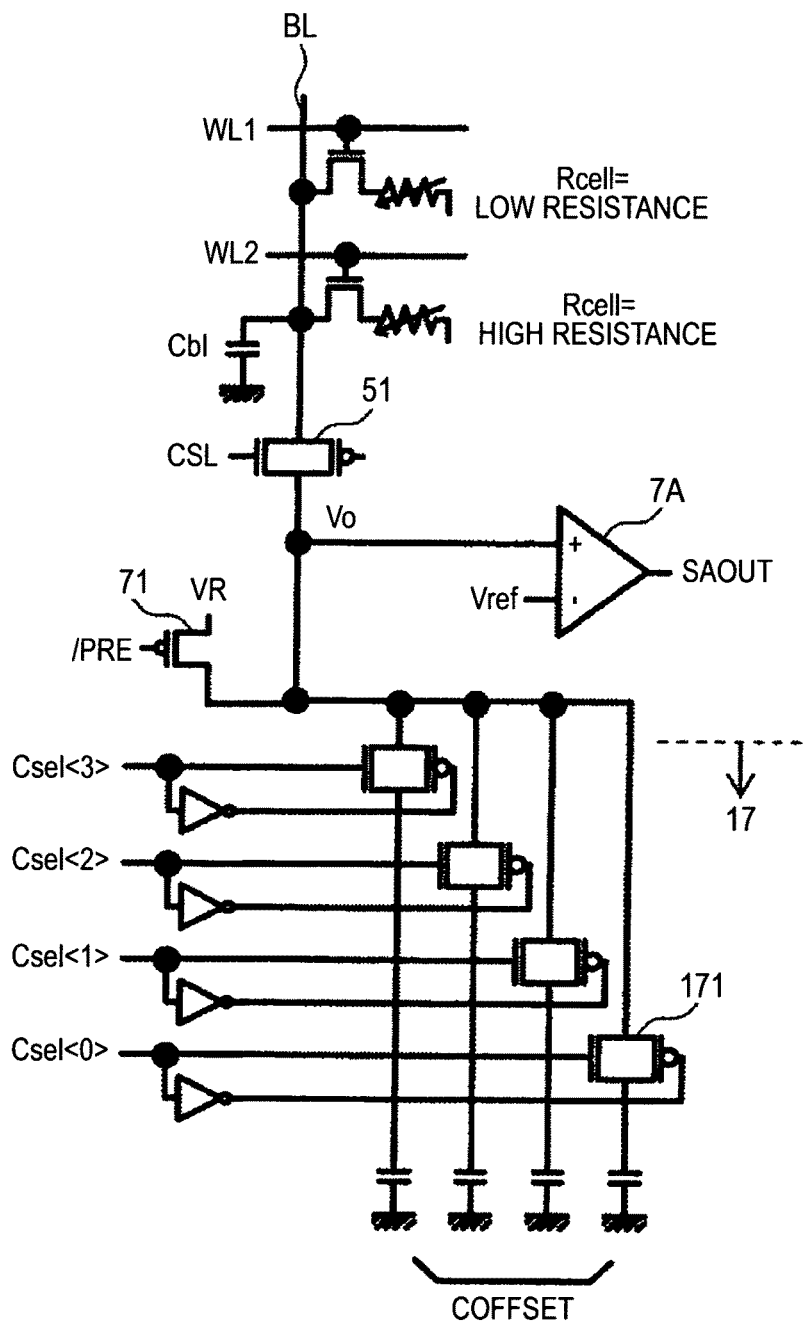
FIG. 9 is a diagram showing the configuration of a column of a memory cell array according to the first embodiment.

In FIG. 9, a schematic diagram of the configuration of a column circuit according to this embodiment is shown together with an example of the circuit of the offset capacitance adding circuit 17 shown in FIG. 4. In the configuration illustrated in FIG. 9, for convenience of the description, memory cell resistors Rcell represent two memory cells including a low-resistance memory cell and a high-resistance memory cell for one bit line BL. The gate of the access transistor of the low-resistance memory cell is connected to the word line WL1, and the gate of the access transistor of the high-resistance memory cell is connected to the word line WL2. In FIG. 9, the load capacitance of the bit line BL is represented by equivalent capacitance denoted by a reference sign "Cbl".

The switch 51 configuring the BLI switch 5 (FIG. 4) is connected between the bit line BL and the sense node (non-inverted input "+") of the sense amplifier 7A. In FIG. 9, the electric potential of the sense node is represented by a sense node electric potential Vo. To the inverted input "−" of the sense amplifier 7A, a predetermined reference electric potential Vref is input.

To the sense node, a precharge transistor (PMOS) 71 that controls application of a read application voltage VR is connected. Although not shown in FIG. 4, the gate of the precharge transistor 71 is controlled in accordance with a precharge signal (/PRE) that is supplied from the control circuit 11. Alternatively, the precharge transistor 71 may be connected to the bit line BL side. The read application voltage VR is set to a level for which a read disturbance does not occur in memory cells other than the memory cell that is connected to the bit line BL as a target for reading data.

The basic configuration of the offset capacitance adding circuit 17 shown in FIG. 9 includes a plurality of (here, four) additional capacitors Coffset and a plurality of (here, four) switches 171 that controls the connection of the additional capacitors to the sense node. The switch 171 is configured by a transfer gate in this example. Thus, a plurality of (here, four) inverters that invert capacitor selection signals Csel<0> to Csel<3>, which are control signals of the transfer gates, are disposed. The capacitor selection signals Csel<0> to Csel<3> (=Csel<3:0>), for example, are generated based on the write•enable signal WRT and the erase enable signal ERS, which are supplied from the control circuit 11 shown in FIG. 4, inside the offset capacitance adding circuit 17.

As above, the configuration shown in FIG. 9 is characterized in that the bit line BL and the sense node electric potential Vo are connected by a switch as a low resistance connection, and additionally, the additional capacitors Coffset that can be switched to the sense node electric potential Vo are disposed. Although not particularly shown in the figure, the configuration of the additional capacitor Coffset is implemented by MOS capacitance (capacitance between the gate electrode and the channel), overlap capacitance between the gate and the source or the drain, or the like. When the layout area is sufficient, the additional capacitor Coffset may be configured by an MIM capacitor.

[Read Operation]

FIG. 10 represents the waveform diagrams of voltages and signals at the time of a read operation according to the first embodiment. When the word line WL is in the inactivated (OFF) level of "L", the precharge signal (/PRE) is in the activated level of "L", and the sense node electric potential Vo and the BL electric potential are read out so as to charge at the application voltage VR. Next, the word line WL1 is activated (ON), and the precharge signal (/PRE) is released to be "H" of the inactivation level. Accordingly, the sense node electric potential Vo and the BL electric potential are discharged in the memory cell from time T1 as its start point. It is assumed that the word line WL1 is a memory cell that is in the low-resistance state. At this time, the load of the sense node electric potential Vo is an increased state due to the capacitor selection signal Csel<3:0>=#E, that is, the additional capacitor Coffset. Accordingly, there is an effect that the discharge rates of the sense node electric potential Vo is decreased.

Next, when the word line WL2 is turned on, similarly, the sense node electric potential Vo and the BL electric potential are discharged in the memory cell from time T2 as its start point. It is assumed that the word line WL2 is a memory cell that is in a high resistance state. At this time, the load of the sense node electric potential Vo is in a decreased state due to the capacitor selection signal Csel<3:0>=#3, that is, the additional capacitor Coffset. Accordingly, there is an effect that the discharge rate of the sense node electric potential Vo is increased.

As above, a method of switching between the additional capacitors Coffset so as to offset a difference in the discharge rate of the sense node electric potential Vo due to the resistance of the memory cell is a key point of the read method according to this embodiment.

[Comparative Example]

Hereinafter, by comparing the above-described reading method with a comparative example, the advantage of an embodiment of the present invention that the discharge rate is uniformized so as to allow the sense timings to be uniform will be further clarified. FIG. 11 shows waveform diagrams in a case where switching between the additional capacitors Coffset is not performed (the capacitance of the additional capacitor Coffset is fixed to a small value). In the case of FIG. 11, in discharging at a time when a high-resistance read operation is performed from time T2 as its start point, the discharge rate is equivalent to that of the case of FIG. 10. On the other hand, it can be known that, in discharging at a time when a low-resistance reading operation is performed from time T1 as its start point, electric charges instantly disappear. It is assumed that the sense timing is set to a sufficient timing such that the BL electric potential falls below the reference electric potential Vref in accordance with discharging performed from T2 shown in FIGS. 10 and 11 as its start point. In such a case, in the low-resistance reading operation performed from time T1 shown in FIG. 11 as its start point, it is difficult to sense the electric potential.

FIG. 12 shows waveform diagrams in a case where switching between the additional capacitors Coffset is not performed, and the capacitance of the additional capacitor Coffset is fixed to a large value. In the case of FIG. 12, in discharging at a time when a low resistance read operation is performed from time T1 as its start point, the discharge rate is appropriate for a read-out operation by using the sense amplifier. However, in discharging at a time when a high resistance read operation is performed from time T2 as its start point, the set capacitance value of the additional capacitor Coffset is too large. Accordingly, the load of the sense node electric potential Vo is high, and the sense speed is extremely decreased.

[Advantages of Embodiment of Present Invention Based On Concrete Examples]

Next, the advantages of an embodiment of the present invention will be described in a quantitative manner by using concrete resistance values. Here, the load capacitance (the capacitance of the load not including the bit line load) of a sense amplifier input portion at a time when the read-out BL voltage VR is supplied to the sense node electric potential Vo is assumed to be Cload. In such a case, the sense node electric potential Vo at a time when electric charges of the load capacitance Cload (of the SA input portion) are dynamically discharged by ReRAM (resistance) is represented by the following Equation (1).

$$Vo = VR \times \exp\{-(\text{Time})/(R\text{cell} \times C\text{load})\} \quad (1)$$

Here, "(Time)" represents a discharge time. It is assumed that Rcell (at the time of a write verify read operation)=10 [KΩ], Rcell (at the time of a normal read operation)=100 [KΩ], and Rcell (at the time of an erase verify read operation)=1 [MΩ].

Figure 13:
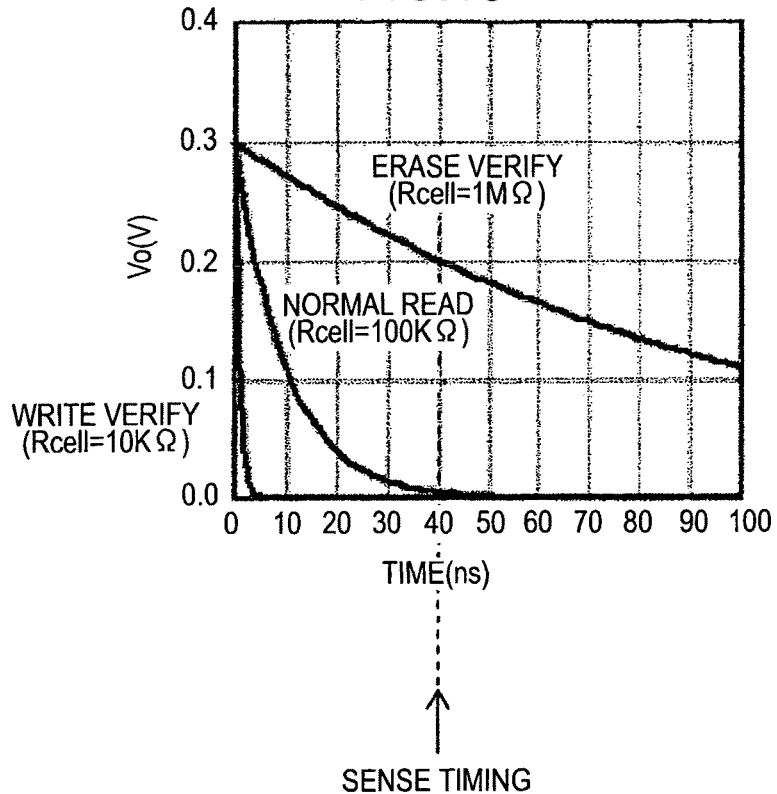
FIG. 13 is a diagram representing a calculation result of a discharge curve of a comparative example.

FIG. 13 is a discharge characteristic diagram of a case, to which an embodiment of the present invention is not applied, where Cload=100 [fF] as being constant. At this time, for example, when the sense timing is 40 [ns], Vo=about 0 [V] for a normal read operation and a low-resistance read operation, and it is difficult to determine the information. Even when a time from the start of discharge to a sense timing is shortened, the discharge rate for a normal read operation is high, and the discharge rate for a low-resistance read operation is higher. Thus, it is difficult to set an optimal sense timing.

Figure 14:
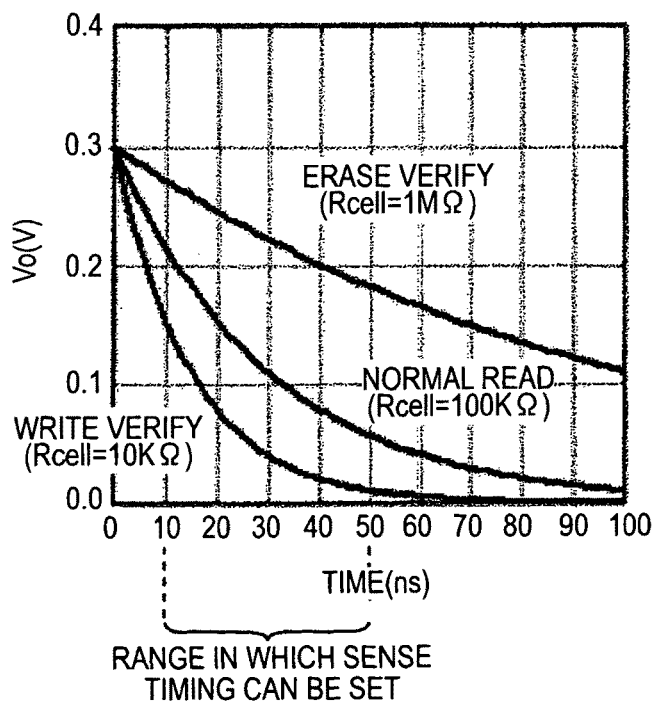
FIG. 14 is a diagram representing a calculation result of a discharge curve according to the first embodiment.

FIG. 14 is a discharge characteristic diagram of a case where a difference in the discharge rate is alleviated by controlling the offset capacitance adding circuit 17 shown in FIG. 9. The offset capacitance adding circuit 17 is controlled in accordance with the type of the read operation that is determined based on the logic of the read-out information. In other words, the offset capacitance adding circuit 17 selects an optimal value of the additional capacitance Coffset depending on whether a read operation is a normal read operation (logic=arbitrary), a write verify read operation (logic="1"), or an erase verify read operation (logic="0") and adds the corresponding additional capacitance to the load of the sense node. FIG. 14 represents a discharge curve after the addition that is acquired by simulation calculation. In addition, similarly to the case of FIG. 13, the cell resistance Rcell (at the time of a write verify read operation)=10 [KΩ], Rcell (at the time of a normal read operation)=100 [KΩ], and Rcell (at the time of an erase verify read operation)=1 [MΩ]. In addition, Cload (at the time of a write verify read operation)=1500 [fF], Cload (at the time of a normal read operation)=300 [fF], and Cload (at the time of an erase verify read operation)=100 [fF].

From FIG. 14, it is apparent that the disappearance of electric charges does not occur in a wide timing range of the discharge time of about 10 [ns] to about 50 [ns], and the voltage amplitude of the sense node electric potential Vo is also secured. Accordingly, the sense timing can be set in the range, for example, of about 10 [ns] to about 50 [ns].

<2. First Modified Example>

Figure 15:
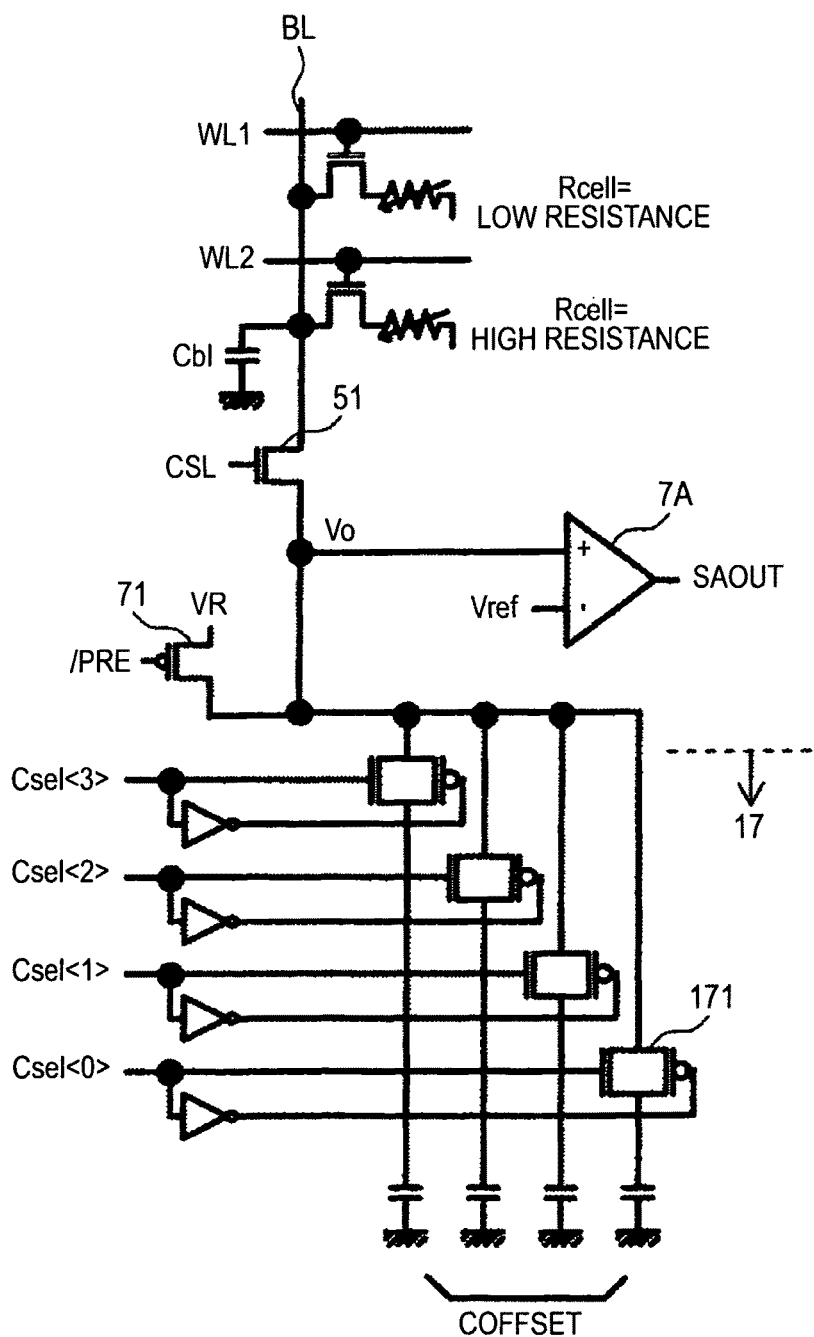
FIG. 15 is a diagram showing the configuration of a column of the first modified example.

Next, a modified example of the first embodiment regarding the BLI switch will be described. FIG. 15 represents a circuit diagram including a first column configuration of a first modified example. In the configuration shown in FIG. 15, the switch 51 that connects the sense node electric potential Vo and the bit line BL is changed from the transfer gate (the first embodiment) to an NMOS transistor.

Figure 16:
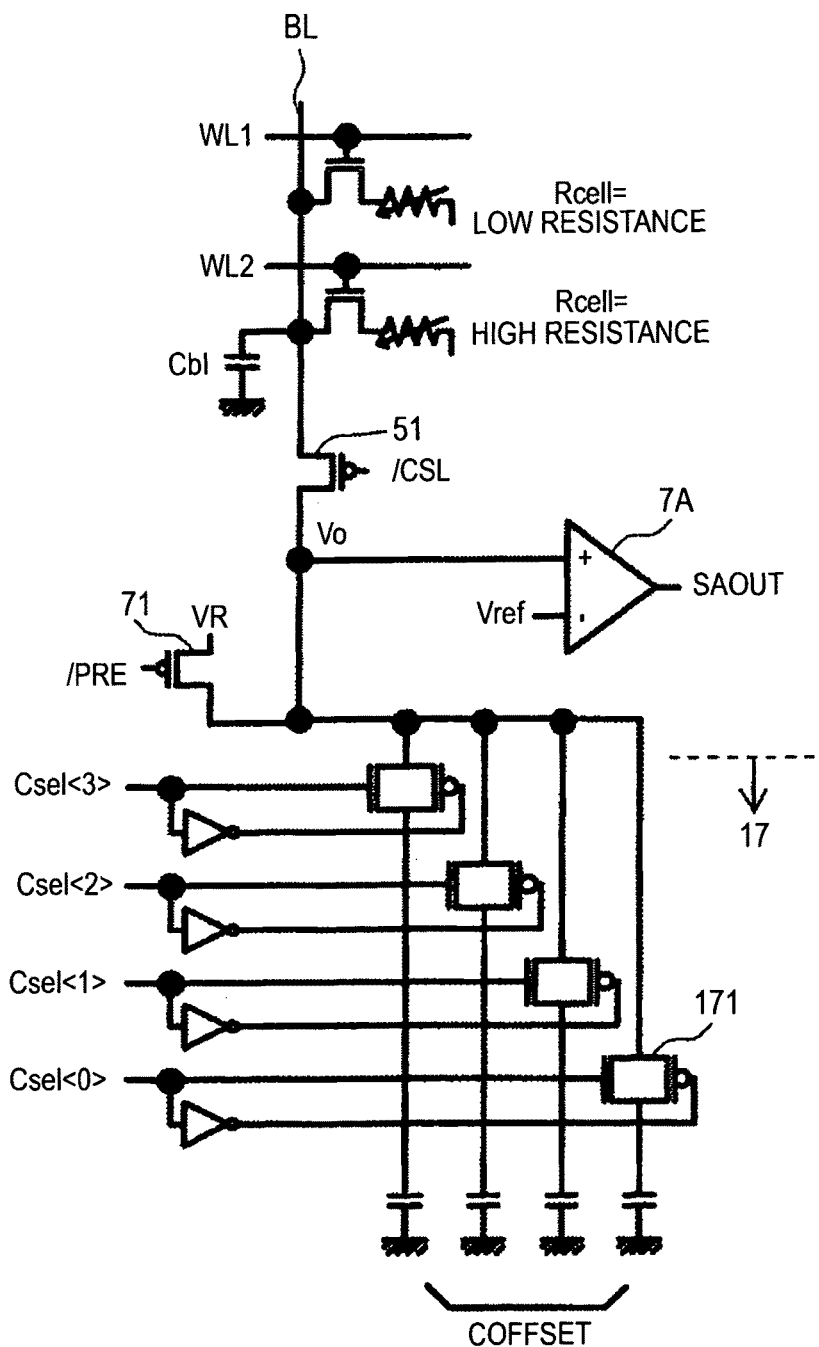
FIG. 16 is a diagram showing the configuration of another column of the first modified example.

FIG. 16 represents a circuit diagram including a second column configuration of the first modified example. In the configuration shown in FIG. 16, the switch 51 that connects the sense node electric potential Vo and the bit line BL is changed from the transfer gate (the first embodiment) to a PMOS transistor.

The switch 51 having the first and the second column configurations serves as a switch that connects the sense node electric potential Vo and the bit line BL through low resistance. Accordingly, the above-described switch has the same function as that of the transfer gate (the switch 51) of the first embodiment. However, there is a difference in the voltage range in which the sense node electric potential Vo and the bit line BL can be connected through low resistance and the number of components. Depending on the operating voltage range, from the viewpoint of the cost, the NMOS transistor having the first column configuration or the PMOS transistor having the second column configuration may be substituted with a transfer gate.

<3. Second Embodiment>

Figure 17:
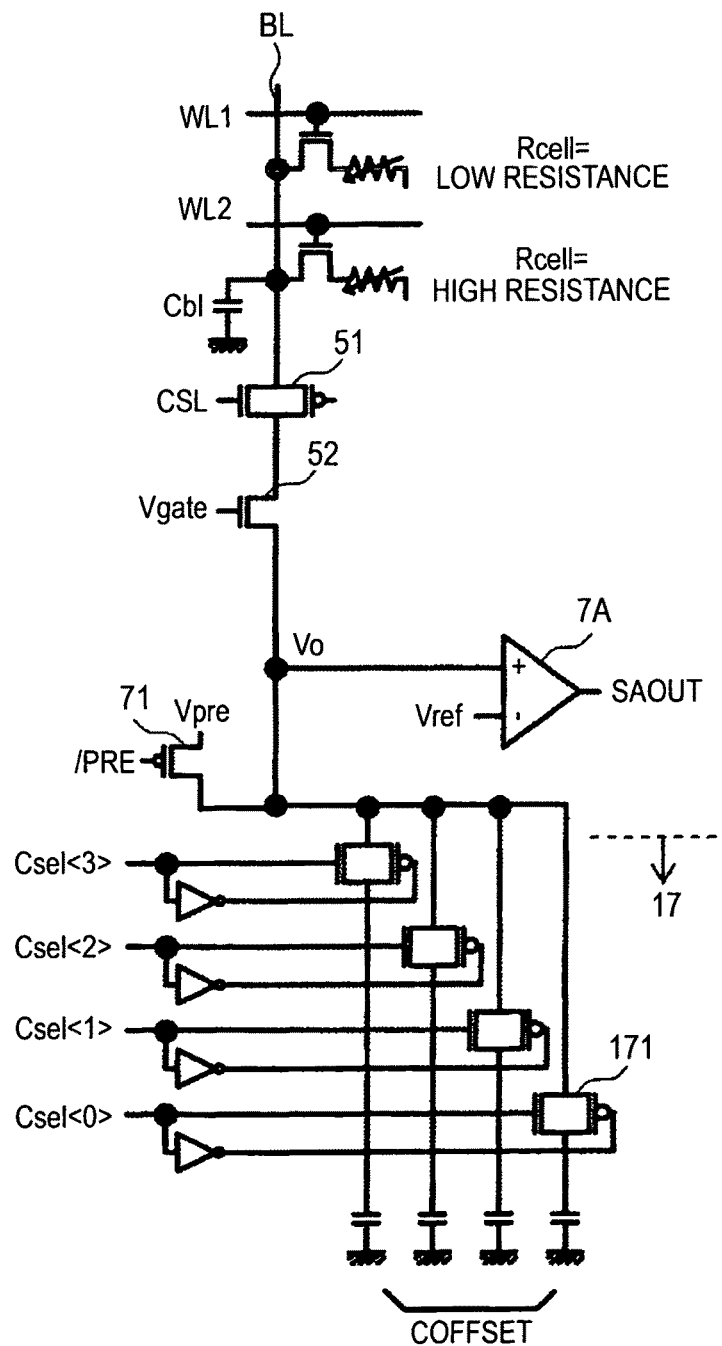
FIG. 17 is a diagram showing the configuration of a column according to the second embodiment.

FIG. 17 represents a circuit diagram including a column configuration according to a second embodiment. In the column configuration illustrated in FIG. 17, when compared to that shown in FIG. 9, an NMOS switch 52 is added between the sense node electric potential Vo and the bit line BL. A voltage VGATE is applied to the gate of the NMOS switch 52 as a "clamp voltage". Accordingly, the BL electric potential is clamped to an electric potential of {VGATE-Vgs (=VR)}. In FIG. 9, a precharge voltage is denoted by a reference sign "VR". However, a precharge voltage Vpre that can be set to a different voltage is applied to the source of the recharge transistor 71.

As one feature of this system, by fixing the BL electric potential, a large amplitude of the sense voltage is secured on the side of the sense node electric potential Vo. Regarding this point, in the first embodiment, a maximum of the amplitude of the sense voltage is 0 [V] to the read application voltage VR. In contrast, in the second embodiment, since the amplitude of the sense voltage is 0 [V] to a precharge voltage Vpre (there is no limitation on Vpre), a voltage setting can be made so as to increase the amplitude of the sense voltage. In addition, in this type, in a sense operation, when the NMOS switch 52 is cut off with an increase in the sense node electric potential, thereafter, the capacitive load of the sense node and the capacitive load of the bit line BL are separated from each other. Accordingly, the capacitive load of the sense node is decreased so as to be suitable for a high-speed operation. Generally, this type is termed a "charge transition type" or the like.

Also in the charge transition type, the connection of the additional capacitor Coffset and the switch thereof that are performed in the first embodiment can be effectively performed. The operation control method and the operation waveform diagram are the same as those of the first embodiment. Thus, hereinafter, only quantitative comparison will be presented.

It is assumed that the capacitive load of the sense node is Cload, the precharge voltage Vpre of the sense node is 1.8 [V], and the read application voltage VR is 0.1 [V]. In such a case, the electric potential Vo of the sense node at a time when the electric charge of the capacitive load Cload (of the SA input portion) is dynamically discharged in the ReRAM cell (resistor) is represented as the following Equation (2).

$$Vo = Vpre - \{(Time)*(VR/Rcell)/Cload\} \quad (2)$$

Here, "(Time)" represents a discharge time. It is assumed that Rcell (at the time of a write verify read operation)=10 [KΩ], Rcell (at the time of a normal read operation)=100 [KΩ], and Rcell (at the time of an erase verify read operation)=1 [MΩ].

Figure 18:
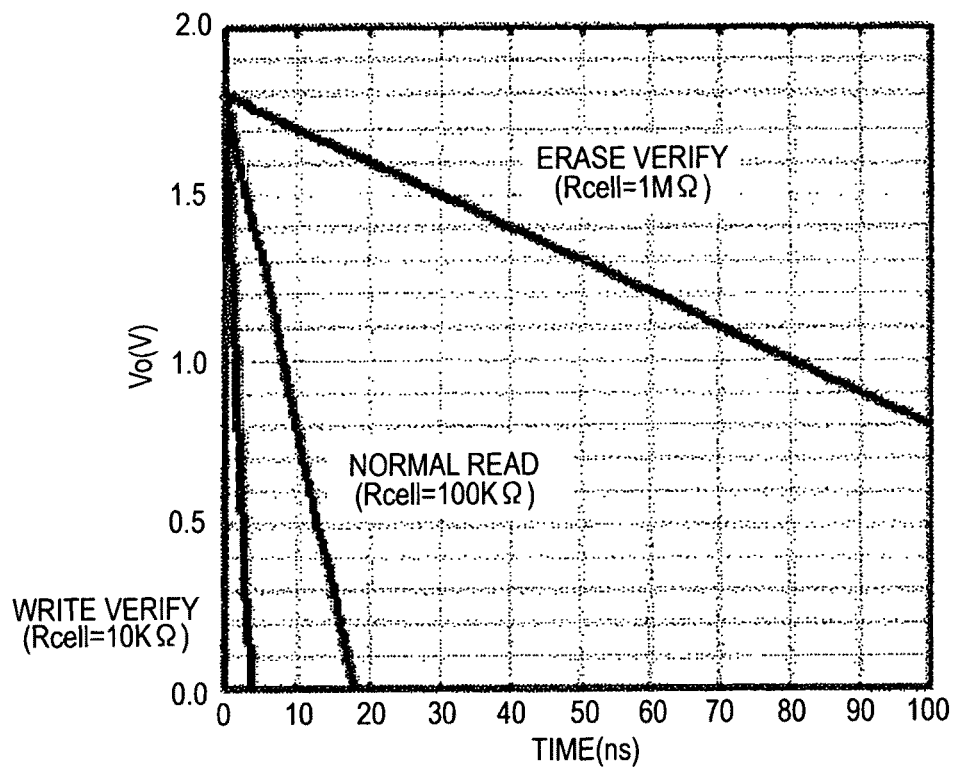
FIG. 18 is a diagram representing a calculation result of a discharge curve of a comparative example before application of an embodiment of the present invention.

FIG. 18 is a discharge characteristic diagram of a case, to which an embodiment of the present invention is not applied, where Cload=10 [fF] is fixed as a constant. In the charge transition type, discharging changes linearly (in the shape of a straight line) with respect to time. At this time, the time range in which a sense timing can be set scarcely exits. Accordingly, it is difficult to determine the information.

Figure 19:
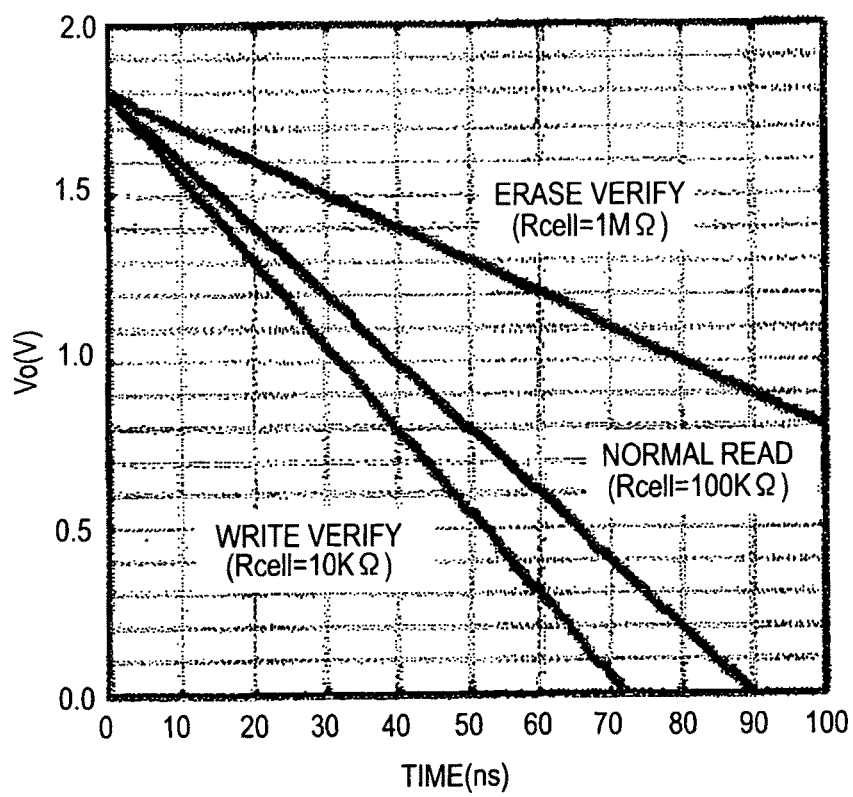
FIG. 19 is a diagram representing a calculation result of a discharge curve according to the second embodiment.

FIG. 19 is a discharge characteristic diagram of a case where a difference in the discharge rate is alleviated by controlling the offset capacitance adding circuit 17 shown in FIG. 17. The offset capacitance adding circuit 17 is controlled in accordance with the type of the read operation that is determined based on the logic of the read-out information. In other words, the offset capacitance adding circuit 17 selects an optimal value of the additional capacitance Coffset depending on whether a read operation is a normal read operation (logic=arbitrary), a write verify read operation (logic="1"), or an erase verify read operation (logic="0") and adds the corresponding additional capacitance to the load of the sense node. FIG. 19 represents a discharge curve after the addition that is acquired by simulation calculation. In addition, the cell resistance, similarly to the case of FIG. 18, Rcell (at the time of a write verify read operation)=10 [KΩ], Rcell (at the time of a normal read operation)=100 [KΩ], and Rcell (at the time of an erase verify read operation)=1 [MΩ]. In addition, Cload (at the time of a write verify read operation)=200 [fF], Cload (at the time of a normal read operation)=50 [fF], and Cload (at the time of an erase verify read operation)=10 [fF].

From FIG. 19, it is apparent that the disappearance of electric charges does not occur in a wide timing range of the discharge time of about 10 [ns] to about 60 [ns], and the voltage amplitude of the sense node electric potential Vo is also secured. Accordingly, the sense timing can be set in the range, for example, of about 10 [ns] to about 60 [ns].

<4. Third Embodiment>

Figure 20:
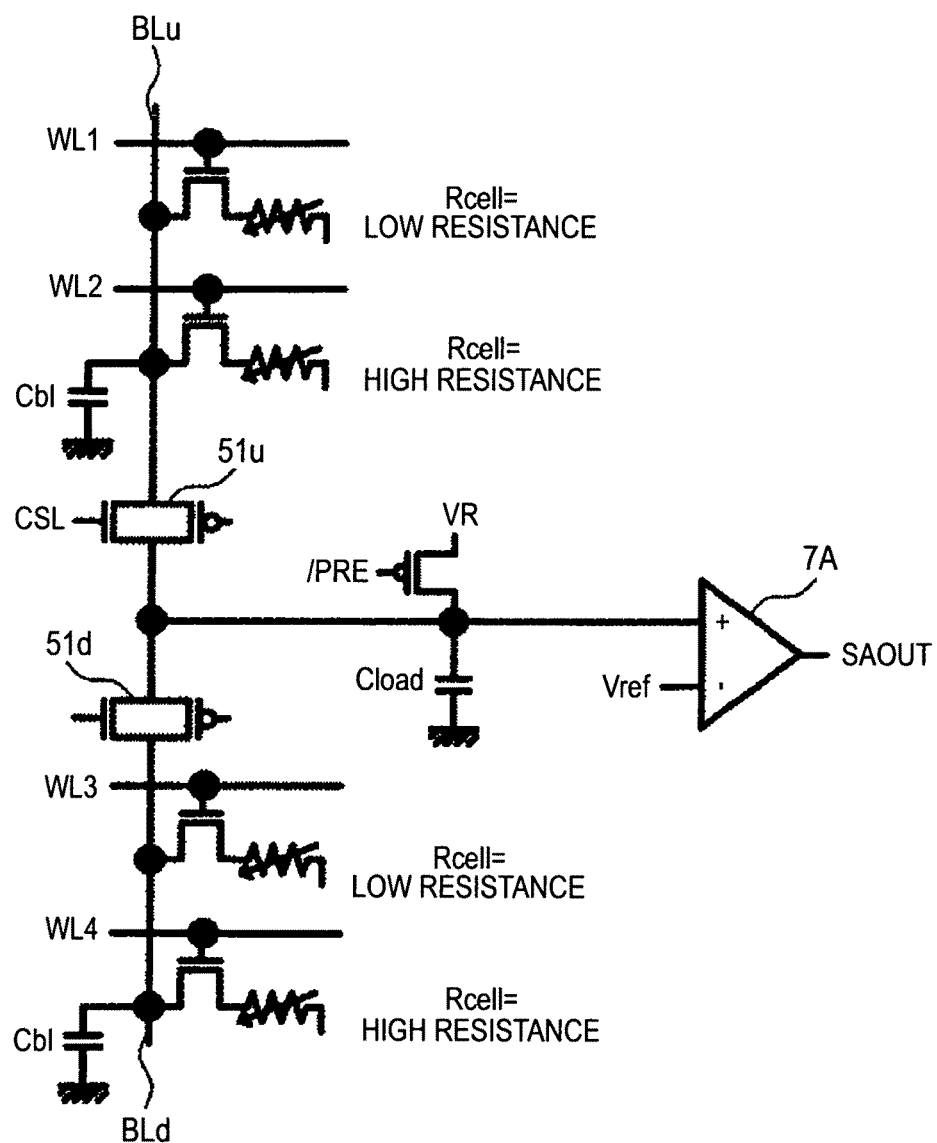
FIG. 20 is a diagram showing the configuration of a column according to the third embodiment.

FIG. 20 represents a column structure diagram that becomes a premise of a third embodiment. In the column structure illustrated in FIG. 20, a memory cell column disposed in the column direction shares one sense amplifier 7A. In particular, the offset capacitance adding circuit 17 shown in the column configuration diagram (FIGS. 9 and 15 to 17) described until now is disposed outside the memory cell array 1 as shown in FIG. 4, and one additional memory cell column is disposed in that portion. Hereinafter, the existing bit line BL is represented by an upper bit line BLu, and a bit line of the additional memory cell column is represented by a lower bit line BLd.

In such an SA sharing column structure, the memory cell column that performs a read operation by using the sense amplifier 7A is one of the upper bit line BLu and the lower bit line BLd. In other words, when the upper bit line BLu is a target for a read-out operation, the lower bit line BLd is not used. On the other hand, when the lower bit line BLd is a target for a read-out operation, the upper bit line BLu is not used.

Such an SA-common structure is a known structure. Commonly, the bit line of an unused memory cell column is separated from the load of the bit line of the memory cell column as an operation target by the switch 51 so as to lessen the operation.

In this embodiment, by controlling a case where the load of the bit line is separated as described above and a case where the load of the bit line is not separated intentionally, a function that is equivalent to the capacitance adding function of the offset capacitance adding circuit 17 (FIG. 9 and the like) of the above-described other embodiments is accomplished. While the offset capacitance adding circuit 17 (FIG. 9 and the like) can set a plurality of capacitance values of the additional capacitors Coffset, in this case, there is only one type (only the capacitance of the load of the bit line of the unused memory cell column) of the additional capacitance value. Accordingly, a switch that switches the capacitance of the load of the bit line and the like also corresponds to a part of a "load capacitance changing unit" according to an embodiment of the present invention.

Figure 21A:
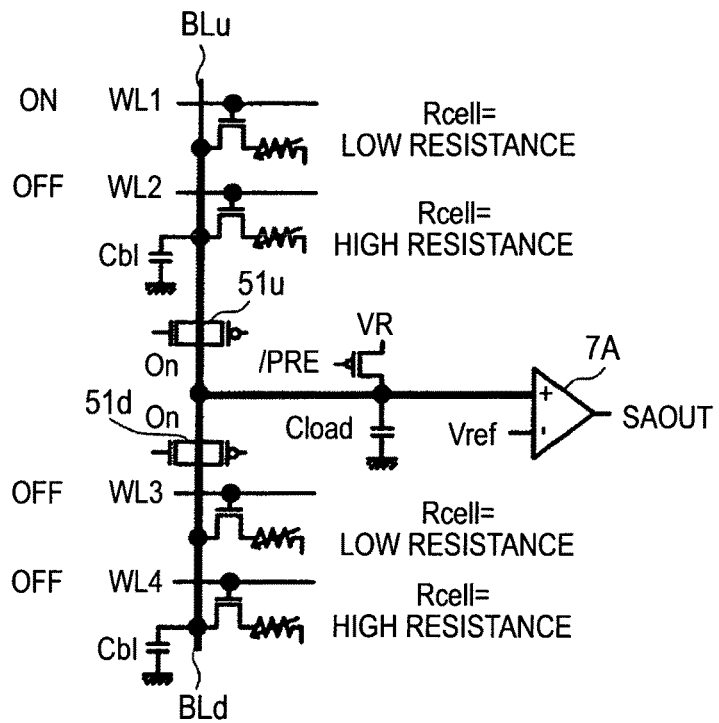
FIGS. 21A and 21B are diagrams illustrating the operation of the circuit shown in FIG. 20.
Figure 21B:
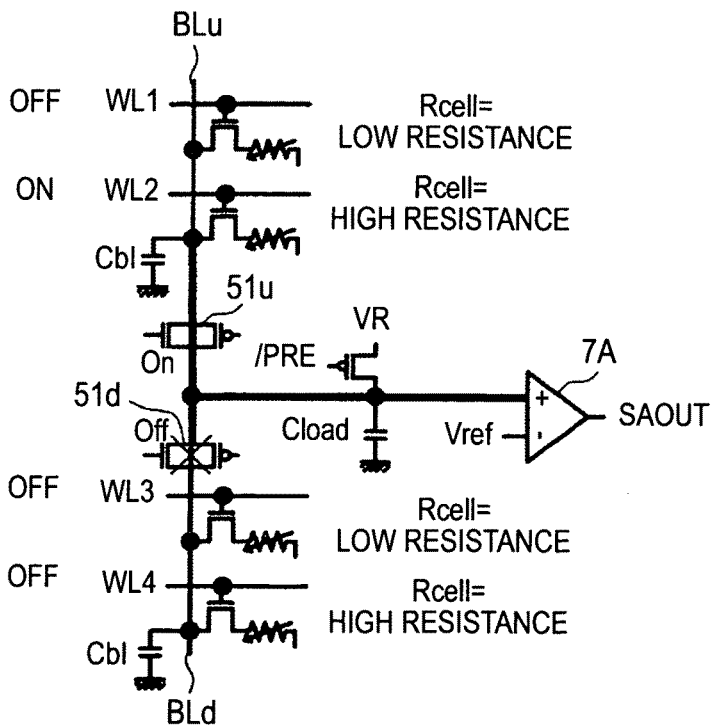

FIGS. 21A and 21B represent diagrams that are similar to FIG. 20, in which a bit line as an operation target is denoted by a thick line, and On and Off states of the switch 51 are added. As a specific example represented in FIGS. 21A and 21B, a capacitance control operation will be described in a quantitative manner. In FIGS. 21A and 21B, when a low-resistance memory cell disposed on the upper side of the sense amplifier 7A is selected, the word line WL1 is in the On state, and the word line WL2 is in the Off state. At this time, the bit line BLd disposed on the lower side of the sense amplifier 7A is in no-operation (the word lines WL3 and WL4 are in the Off state). The lower bit line BLd that is in no-operation is used as an additional capacitor Coffset. When operated as represented in FIG. 21A, the additional capacitance Coffset=Cbl, and the capacitive load of the sense node becomes (Cload+2*Cbl).

On the other hand, as represented in FIG. 21B, when a high-resistance memory cell disposed on the upper side of the sense amplifier 7A is selected, the word line WL2 is changed to be in the On state, and the word line WL1 is changed to be in the Off state. In addition, out of the upper switch 51$u$ and the lower switch 51$d$ that are turned on in FIG. 21A, the lower switch 51$d$ is turned off. Accordingly, the additional capacitance Coffset=0 [V], and the capacitive load of the sense node becomes (Cload+1*Cbl).

<5. Fourth Embodiment>

In a fourth embodiment, similarly to the above-described third embodiment, unused wiring capacitance is used as additional capacitance. However, in the third embodiment, a variation in the value of the additional capacitance is insufficient. Thus, an embodiment that solves such a problem will be described as the fourth embodiment.

Figure 22:
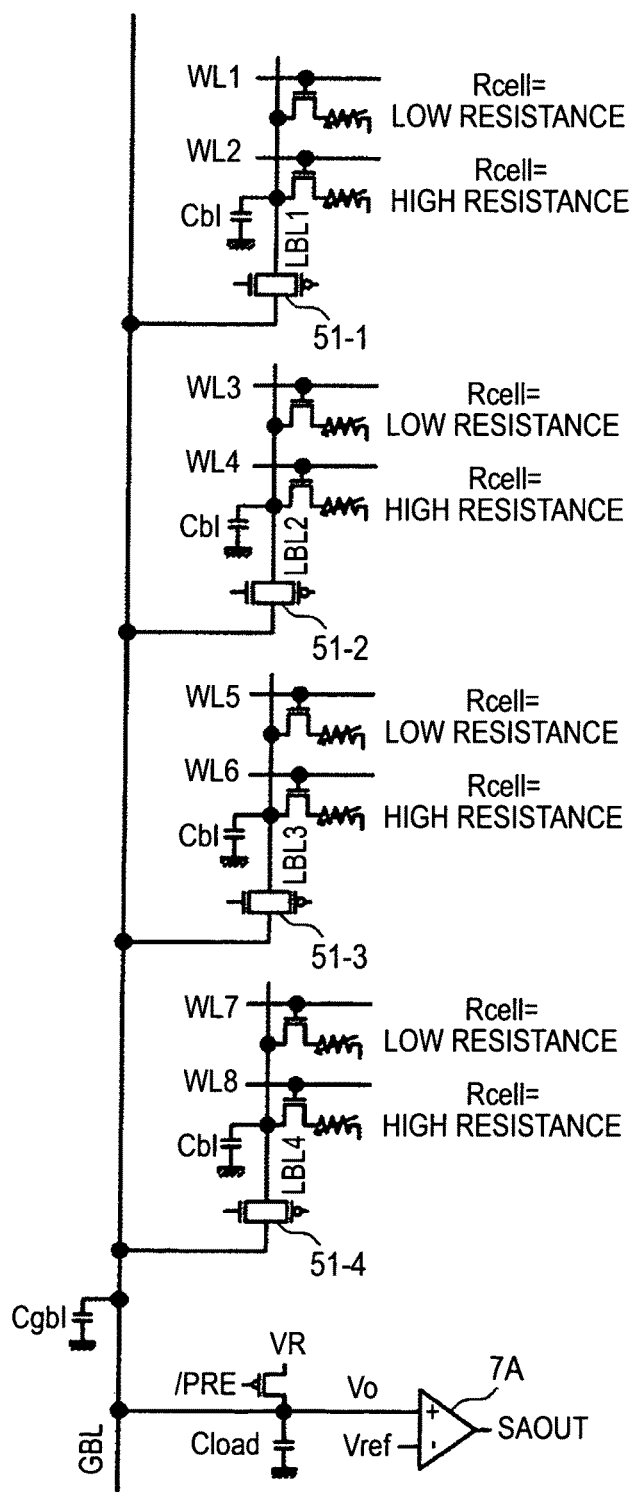
FIG. 22 is a diagram showing the configuration of a column according to the fourth embodiment.

FIG. 22 represents a column configuration diagram that becomes a premise of the fourth embodiment. The bit lines shown in FIGS. 9 and 15 to 17 are not layered. In contrast, in the column configuration, which is illustrated in FIG. 22, according to this embodiment, a bit line denoted by a reference symbol "BL" in other embodiments is layered to be a global bit line GBL and local bit lines LBL. The global bit line GBL is connected to the sense amplifier 7A, and a plurality of (here, four) memory cell rows are connected to one global bit line GBL in parallel. Here, the (bit-line blocking) switch 51 shown in FIGS. 9 and 15 to 17 is substituted with switches 51_1 to 51_4 disposed in connection positions of each memory cell row and the global bit line GBL.

The switches 51_1 to 51_4 are switches that serve as the switch 51 and the switch 171 shown in FIG. 9 and the like. In other words, these four parallel switches serve as the function of the switch 51 shown in FIG. 9 and the like for a memory cell row including a memory cell as a read operation target and serve as the function of the switch 171 shown in FIG. 9 for an unused memory cell row. In the unused memory cell row, the capacitive loads of the local bit lines LBL1 to LBL4 that are connected to the ends of the switches 51_1 to 51_4 accomplish the function equivalent to that of the additional capacitor Coffset disposed within the offset capacitance adding circuit 17 shown in FIG. 9 and the like.

In the above-described bit-line layered structure, a memory cell that performs a read operation by using the sense amplifier 7A selects a memory cell row including the memory cell by turning on one of the switches 51_1 to 51_4 and turning off the others thereof. Accordingly, one local bit line LBL is connected to the sense node of the sense amplifier 7A through the global bit line GBL. In addition, by turning on one word line of a plurality of memory cells sharing the local bit line LBL connected to this sense node, the memory cell as an operation target is selected.

FIGS. 23A and 23B represent diagrams that are similar to FIG. 22, in which layered bit lines electrically connected to a sense node are denoted by thick lines, and On and Off states of the switch are added. As a specific example represented in FIGS. 23A and 23B, a capacitance control operation will be described in a quantitative manner. FIGS. 23A and 23B are examples in which a word line WL3 or a word line WL4 is turned on, and a low resistance memory cell or a high resistance cell respectively connected thereto is selected.

When the word line WL3 to which a low resistance readout memory cell is connected is turned on, other words lines are turned off. In addition, since an increase in the load capacitance of the sense node is necessary, all the switches 51_1 to 51_4 are turned on. In the state as shown in FIG. 23A, the additional capacitance Coffset=3*Cbl, and the capacitive load of the sense node becomes (Cload+Cgbl+4*Cbl). Here, "Cgbl" denotes the load capacitance of the global bit line GBL.

FIG. 23B represents a case where a high-resistance memory cell that is connected to the word line WL4 is selected. In such a case, a decrease in the capacitive load of the sense node is desired when a high-resistance read operation is performed. Thus, the non-operated BL is not used as in the low-resistance read operation. In the state as shown in FIG. 23B, the additional capacitance Coffset=0, and the capacitive load of the sense node becomes (Cload+Cgbl+1*Cbl).

According to the above-described first to fourth embodiments and the first modified example, in an ReRAM that performs a so-called dynamic read operation, the range of a timing setting for a single end-type sense amplifier is increased. Therefore, an advantage is obtained in that a design margin of a malfunction can be implemented in an easy manner.

Hereinafter, an ReRAM, which has a differential amplification-type sense amplifier, according to an embodiment of the present invention will be described. In the case of the differential amplification-type sense amplifier, the load of the reference node such as resistance or capacitance is changed so as to increase the number of parameters. Accordingly, it is necessary to describe the advantage according to an embodiment of the present invention by using numeric expressions in a quantitative manner. Thus, before the description of embodiments presented below, first, a comparative example to which an embodiment of the present invention is not applied will be described.

<6. Comparative Example>

In a verify read operation of a differential amplification-type sense amplifier, similarly to a single end-type, a write operation is repeated until the value of low-resistance state resistance Rset is smaller than a set•verify threshold (Rth-set). Then, when the condition of "Rset<(Rth-set)" is satisfied, the write operation is successful. On the other hand, in a high-resistance state verify•read operation, a write operation is repeated until that value of a reset resistance Rreset is larger than a reset•verify threshold (Rth-reset). Then, when the condition of "Rreset>(Rth-reset)" is satisfied, the write operation is successful.

When a determination threshold of an ordinary data read operation is Rth, (Rth-set)<Rth<(Rth-reset). Accordingly, the determination thresholds in the set•read operation, the ordinary read operation, and a reset•read operation have values that are different from (Rth-set), Rth, and (Rth-reset).

Here, {Rth−(Rth-set)} and {(Rth-reset)−Rth} are reliability margins of Rset and Rreset.

As above, a multiple-value reading circuit is necessary even for a binary memory of non-volatile type. In addition, a complex reading circuit for reading multiple values additional to values of the binary memory is necessary for a memory that writes data in multiple values.

Figure 24:
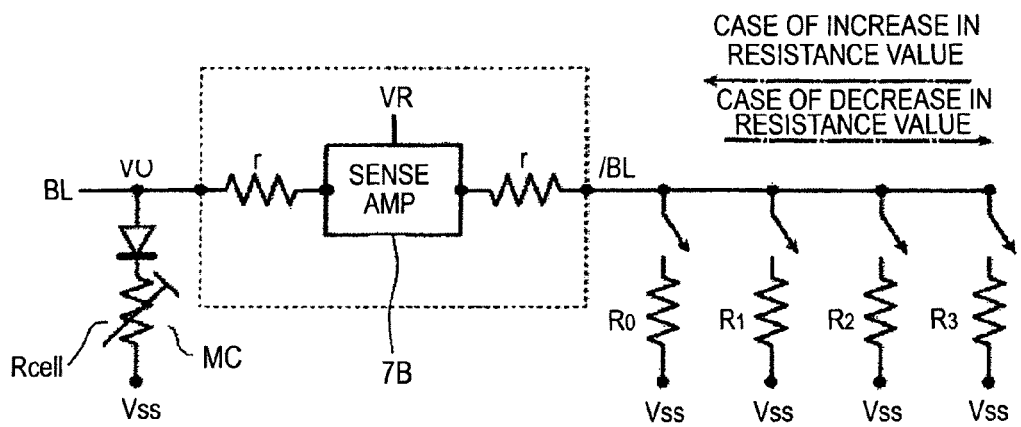
FIG. 24 is a conceptual diagram showing the configuration of a comparative example for the fifth embodiment and thereafter.

FIG. 24 is a circuit diagram showing an example of implementation of a multiple-value reading circuit according to this comparative example. In a circuit shown in FIG. 24, a specific configuration of a differential amplification-type sense amplifier 7B is not clearly shown. However, the differential amplification-type sense amplifier has a circuit configuration in which switching between reference resistors is performed for each threshold.

Figure 25:
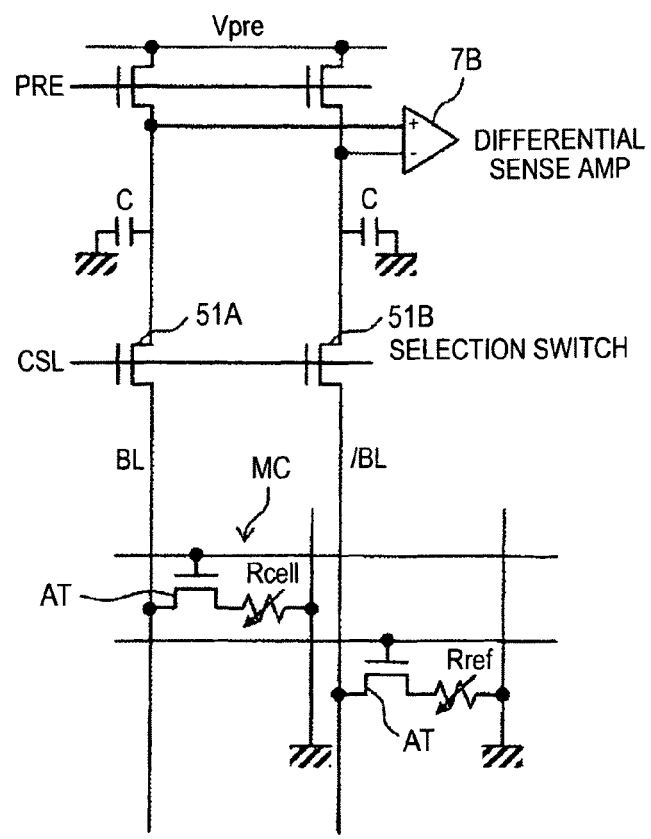
FIG. 25 is a diagram showing the configuration of a column of the comparative example implementing the concept represented in FIG. 24 by using cell resistance.

In the circuit shown in FIG. 24, there are disadvantages as below. As the differential sense amplifier 7B that determines the magnitude relationship between two resistors, a circuit shown in FIG. 25 can be used. A memory cell shown in FIG. 24 is configured by one diode D and one variable resistor R. On the other hand, a memory cell shown in FIG. 25 is configured by one transistor T and one variable resistor R. Although there is such a difference, as the differential sense amplifier 7B, the same memory cell can be used in both the circuits.

As shown in FIG. 25, a precharge circuit that controls the supply of a precharge voltage Vpre to a pair of bit lines BL and /BL is connected to two inputs of the differential sense amplifier 7B. In addition, to each of the two sense inputs, a memory cell resistor Rcell or a reference resistor Rref is connected through a selection switch 51A or 51B and an access transistor AT. In particular, the memory cell resistor Rcell is connected to the non-inverted input "+" of the differential sense amplifier 7B through the bit line BL. The reference resistor Rref is connected to the inverted-input "−" of the sense amplifier 7B through a complement bit line /BL.

In this circuit, after the input of the differential sense amplifier 7B is precharged at Vpc, the input is discharged through Rcell and Rref by using the selection switch, and a discharge electric potential difference is read out by the sense amplifier 7B.

Here, the capacitor C that is connected to the input of the sense amplifier 7B indicates equivalent capacitance. Thus, total capacitance may be parasitic capacitance of the circuit or capacitance provided by actually adding a capacitor. The circuit shown in FIG. 25 uses MOS transistors as the selection switches 51A and 51B. However, bipolar transistors may be used as the selection switches.

This circuit performs different operations in accordance with the operating region of the selection switches 51A and 51B. When the selection switches 51A and 51B operate as resistors, the circuit discharges (CR discharge) in accordance with a time constant τ that is determined by the capacitance C and the resistance R (total resistance having Rcell or Rref as its main component). At this time, the operation of the selection switches 51A and 51B as resistors represents an operation in a linear region in a case where the switches are MOS transistors and an operation in a saturation region in a case where the switches are bipolar transistors.

In order to allow the selection switches 51A and 51B to operate as a constant current source, the selection switches are controlled so as to be used in a saturation operating region in a case where the switches are MOS transistors or to be used in a non-saturation operating region in a case where the switches are bipolar transistors. In such a case, the discharge rate is controlled by the constant current source. Accordingly, constant current discharge having a constant rate is performed. The operating region of the selection switch can be controlled by the voltage value of the gate thereof or the voltage of the base thereof.

Figure 26:
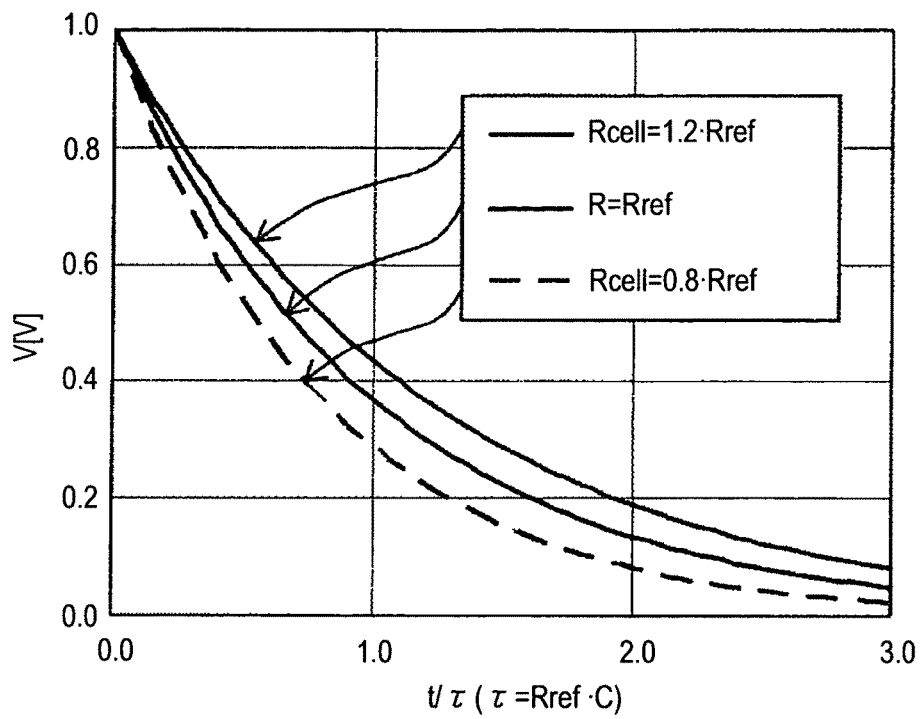
FIG. 26 is a graph representing a CR discharge curve of the comparative example.

FIG. 26 represents a discharge curve in a case where the CR discharge is performed. A discharge voltage V can be represented as the following Equation (3).

$$V = V\text{pre} * \exp\{-t/(C*R)\} \quad (3)$$

Here, the resistance of the access transistor AT of the memory cell, the resistance of the selection switches 51A and 51B, and the wiring resistance are assumed to be sufficiently low and are ignored.

In FIG. 26, Vpre=1 [V], and the X axis is normalized by t/τ (τ=C*Rref). In FIG. 26, a curve of a reference voltage at R=Rref and curves of detected voltages of two types at Rcell=1.2*Rref and Rcell=0.8*Rref are shown. The change in the magnitude of Rcell corresponds to switching between resistors R0 to R3 in the case of FIG. 24.

Figure 27:
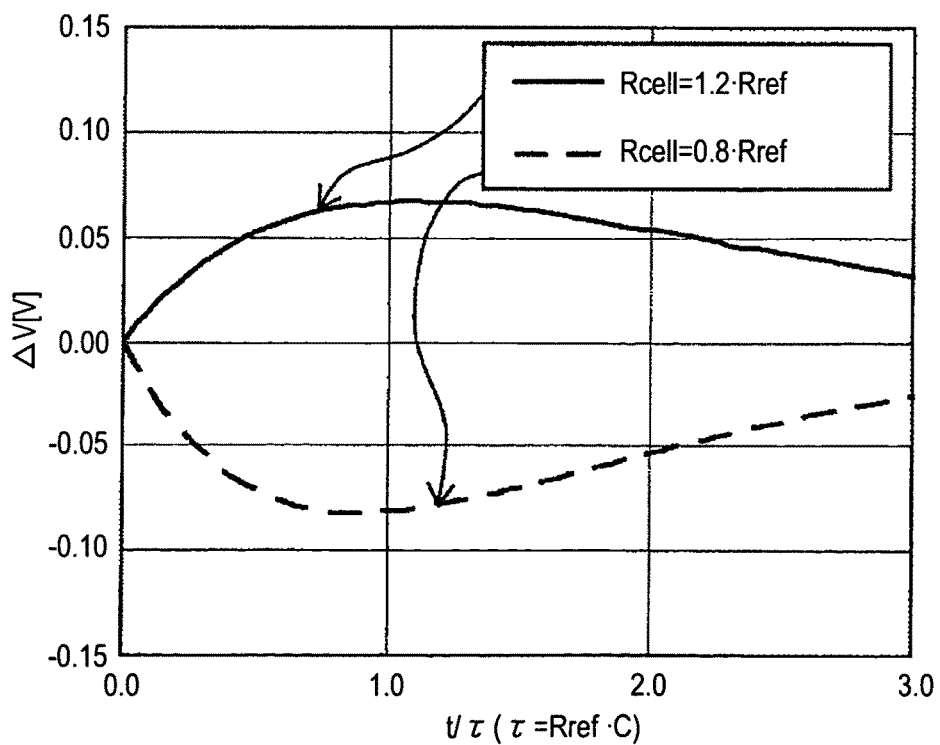
FIG. 27 is a graph representing a change in the sense voltage at the time of CR discharge according to the comparative example.

FIG. 27 shows a difference between the detected voltage and the reference voltage, that is, a change in the sense voltage Δ[V]. As shown in FIG. 27, the sense voltage Δ[V] rises from the start of the sense discharge. However, when further time elapses, the discharge is completed, and the sense voltage disappears. A maximum sense voltage is acquired at t=τ=C*Rref. Thus, this timing (the memory is 1.0 in the horizontal axis) becomes the optimal sense timing.

Figure 28:
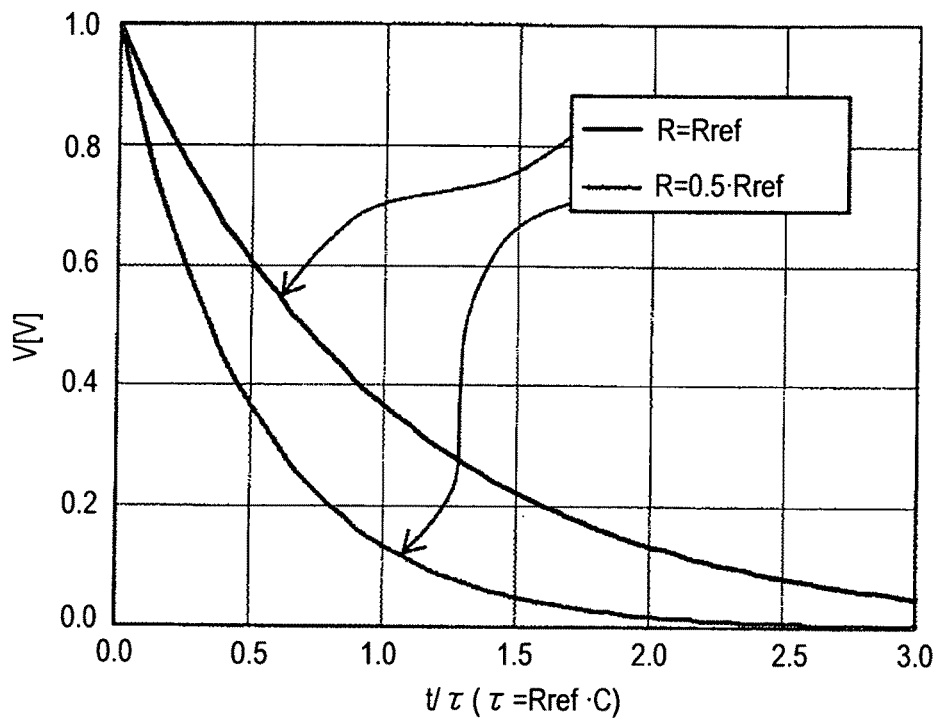
FIG. 28 is a graph representing a CR discharge curve of the comparative example when reference resistance is further lowered.
Figure 29:
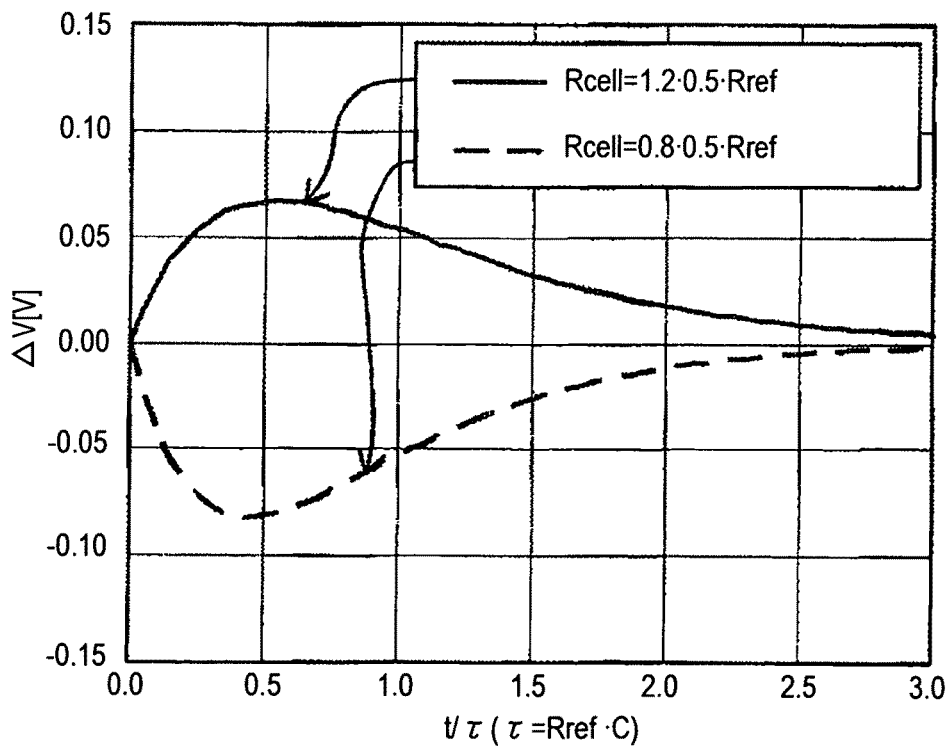
FIG. 29 is a graph representing a change in the sense voltage at the time of CR discharge according to the comparative example when the reference resistance is further lowered.

Next, a case where Rcell is decreased up to (0.5*Rref) will be considered. A CR discharge curve and a change in the sense voltage for this case are shown in FIGS. 28 and 29. In a case where the cell resistance on the reference side is changed to (0.5*Rref), as shown in FIGS. 28 and 29, the optimal sense timing is advanced to (0.5*C*Rref). Although not shown in the figure, in a case where the reference resistance is changed to (2*Rref), the optimal sense timing is delayed to (2*C*Rref).

Figure 30:
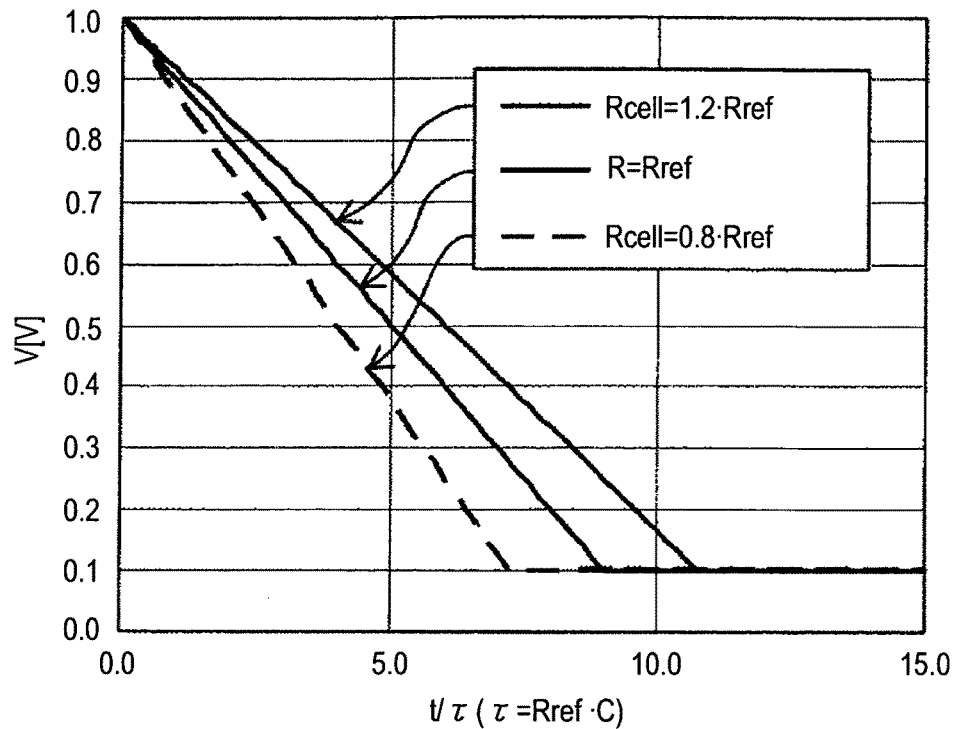
FIG. 30 is a graph representing a constant-current discharge curve of the comparative example.

FIG. 30 represents a CR discharge curve for the case of constant-current discharge. A discharge voltage V of this case is represented as the following Equation (4).

$$V = V\text{pre} - VR*t/(C*R) \quad (4)$$

Here, the resistance of the access transistor AT of the memory cell, the resistance of the selection switches 51A and 51B, and the wiring resistance are assumed to be sufficiently low and are ignored.

In FIG. 30, the read application voltage VR is a voltage of a pair of bit lines, that is, a voltage that is applied between the memory cell and the reference cell. In FIG. 30, Vpre=1 [V] and VR=0.1 [V], and the X axis is normalized by t/τ (τ=C*Rref). In FIG. 28, a curve of a reference voltage at R=Rref and curves of detected voltages of two types at Rcell=1.2*Rref and Rcell=0.8*Rref are shown.

Figure 31:
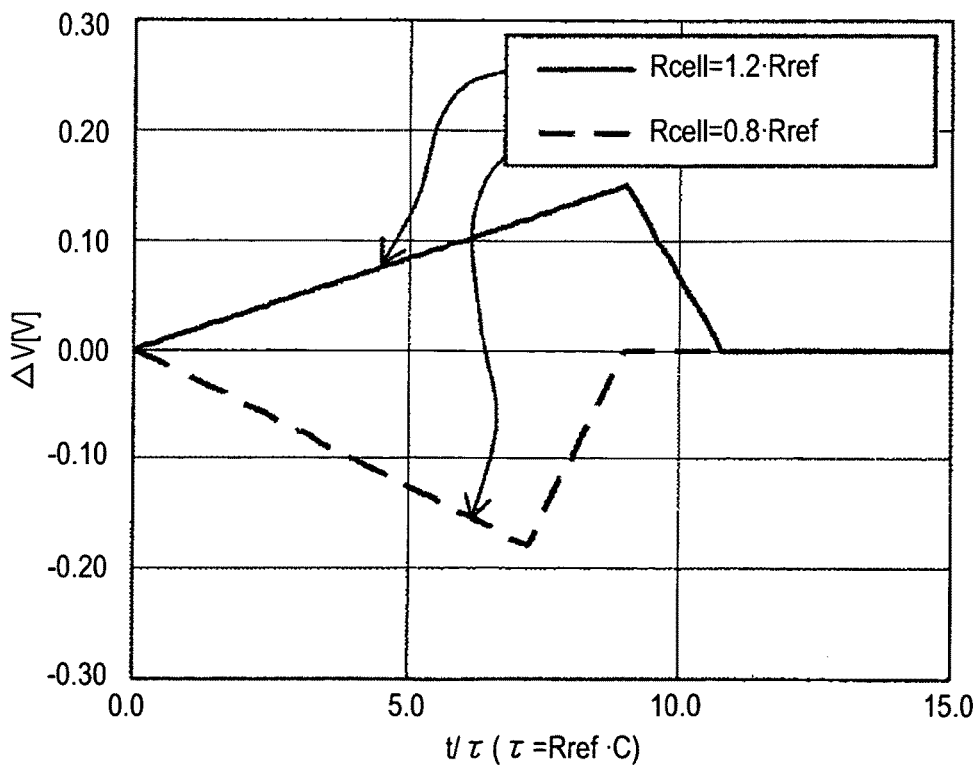
FIG. 31 is a graph representing a change in the sense voltage at the time of constant-current discharge according to the comparative example.

FIG. 31 shows a difference between the detected voltage and the reference voltage, that is, a change in the sense voltage Δ[V]. As shown in FIG. 31, the sense voltage Δ[V] rises from the start of the sense discharge. However, when further time elapses, the discharge is completed, and the sense voltage disappears. A maximum sense voltage can be acquired immediately prior to disappearance of the sense voltage. However, it is difficult to manage the time immediately prior to the disappearance of the sense voltage. Thus, generally, the center of the dynamic range of the voltage and the time, which is a timing near (t=5*τ=5*C*Rref) in the example represented in FIG. 31 becomes the optimal sense timing.

Figure 32:
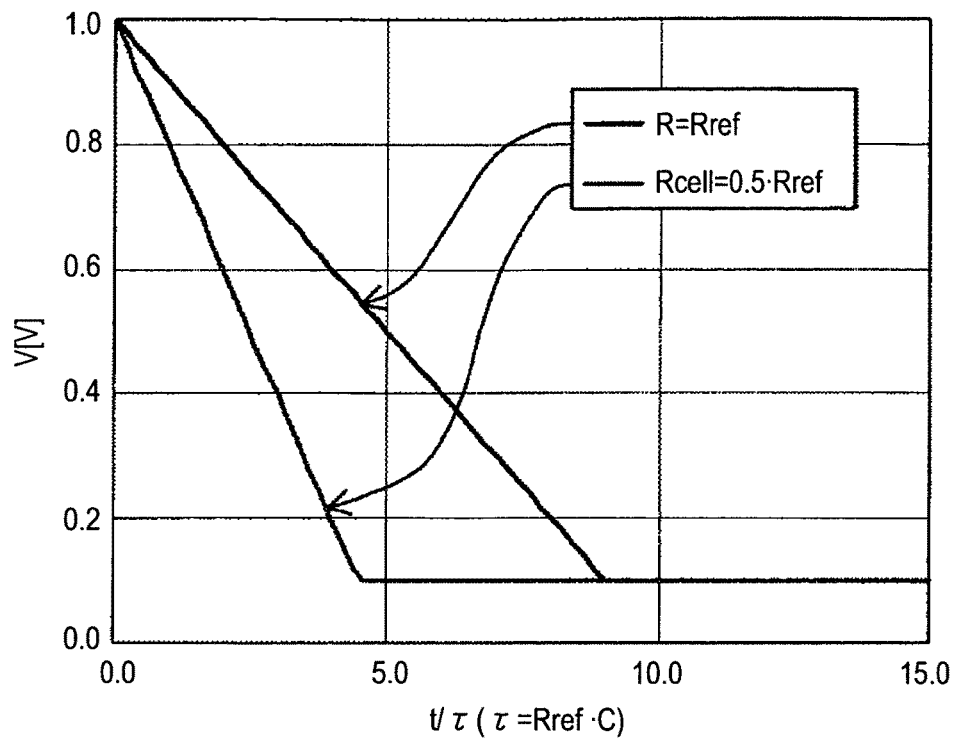
FIG. 32 is a graph representing a constant-current discharge curve according to the comparative example, when the reference resistance is further lowered.
Figure 33:
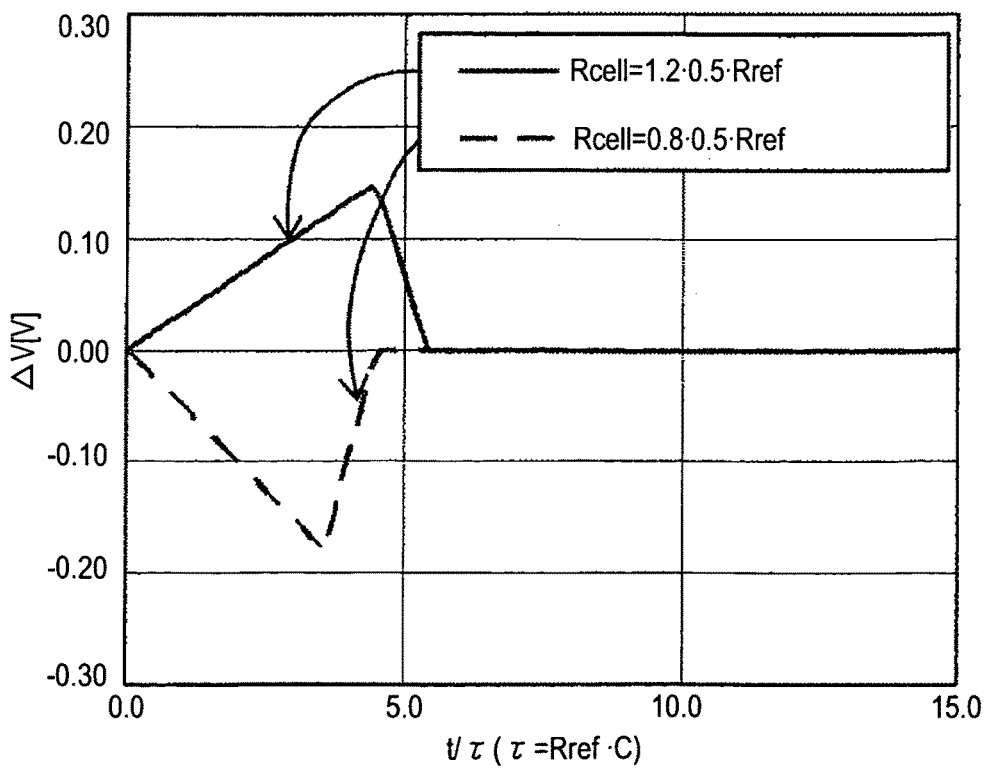
FIG. 33 is a graph representing a change in the sense voltage at the time of constant-current discharge according to the comparative example when the reference resistance is further lowered.

Next, in the constant-current discharge, a case where Rcell is decreased up to (0.5*Rref) will be considered. A constant-current discharge curve and a change in the sense voltage for this case are shown in FIGS. 32 and 33. In a case where the cell resistance on the reference side is changed to (0.5*Rref), as shown in FIGS. 32 and 33, the optimal sense timing is advanced to (0.5*5*C*Rref). Although not shown in the figure, in a case where the reference resistance is changed to (2*Rref), the optimal sense timing is delayed to (2*5*C*Rref).

As described above, it is necessary to change the sense timing in both the CR discharge and the constant-current discharge when Rref is changed. Accordingly, there is a disadvantage in that a circuit changing the sense timing is necessary. In addition, since the sense timing is changed, there is a disadvantage in that the throughput varies. Furthermore, there is a disadvantage in terms of costs by disposing a plurality of reference resistors having high accuracy in accordance with multiple-value levels.

<7. Fifth Embodiment>

Figure 34:
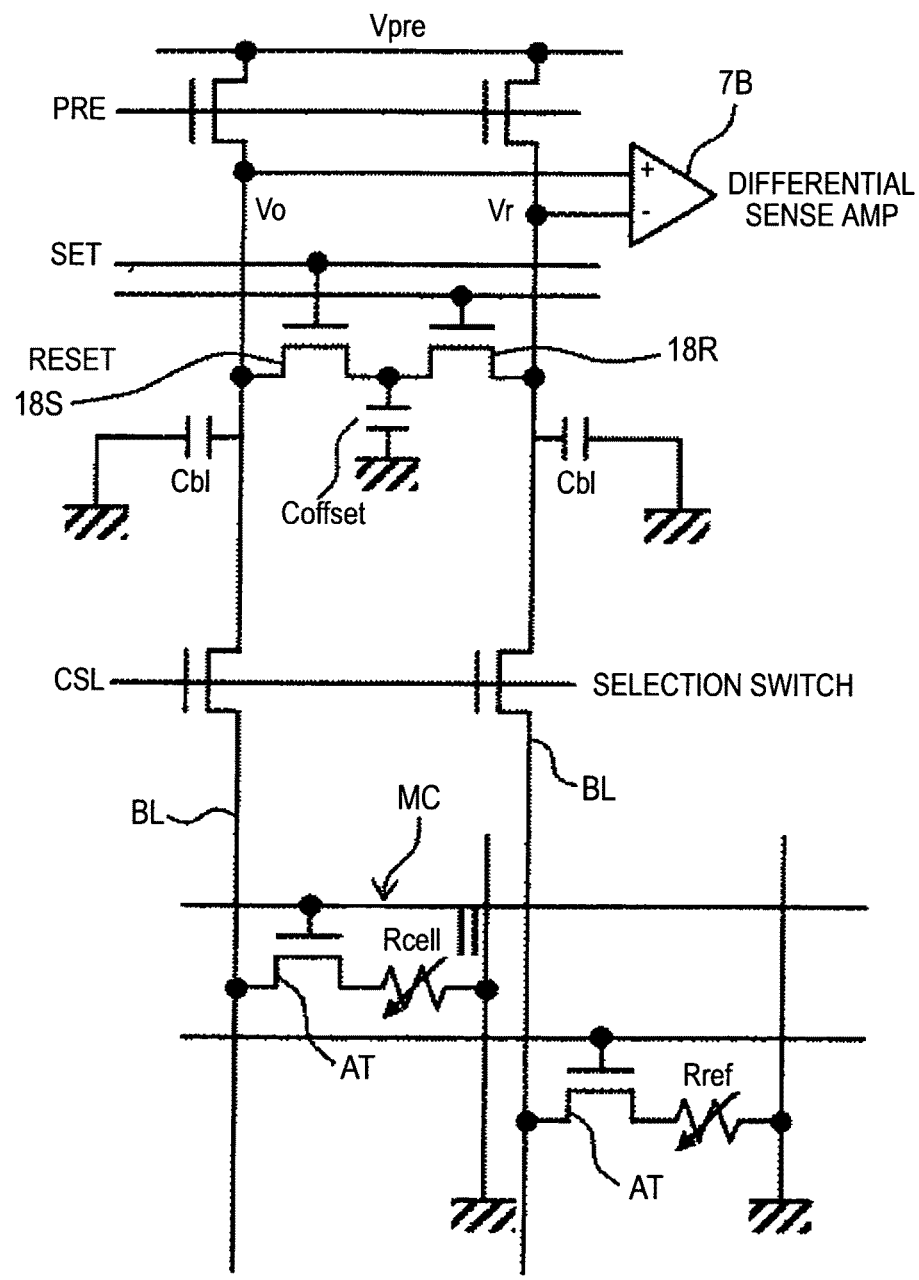
FIG. 34 is a circuit diagram showing the structure of a column connected to a pair of bit lines according to the fifth embodiment.

FIG. 34 represents the configuration of a pair of bit lines according to a fifth embodiment of the present invention. When the configuration represented in FIG. 34 is compared to the comparative example represented in FIG. 25, a set capacitance switch 18S, a reset capacitance switch 18R, and an additional capacitor Coffset are added. In this example, a case where two capacitance switches 18S and 18R are NMOS transistors is shown. However, the two capacitance switches may be PMOS transistors or transfer gates. These added capacitance switches and the additional capacitor correspond to a part of a "load capacitance changing unit" according to an embodiment of the present invention.

The set capacitance switch 18S and the reset capacitance switch 18R are connected to the pair of bit lines BL and /BL in series, and the additional capacitor Coffset is connected between a node disposed between the switches and a reference electric potential line (for example, the GND line). The set capacitance switch 18S is controlled in accordance with a set reading signal SET that is supplied from the control circuit 11 shown in FIG. 4. The reset capacitance switch 18R is controlled in accordance with a reset reading signal RSET that is supplied from the control circuit 11 shown in FIG. 4.

In the configuration shown in FIG. 34, in an ordinary read operation, the signals are controlled such that SET=L and RSET=L. At this time, both the capacitance switches 18R and 18S are turned off. Accordingly, both the capacitance of the sense node input and the capacitance of the reference input have a value that is equivalent to the capacitance value Cbl of the bit line or the complement bit line.

In a set verify•read operation, the signals are controlled such that SET=H and RSET=L. Accordingly, in order to allow the set capacitance switch 18S to be turned on, the capacitance of the sense node input becomes (Cbl+Coffset), and the capacitance of the reference input becomes Cbl.

On the other hand, in a reset verify•read operation, the signals are controlled such that SET=L and RSET=H. Accordingly, the capacitance switch to be turned on is changed, and the capacitance of the sense node input becomes Cbl, and the capacitance of the reference input becomes (Cbl+Coffset).

The reference resistor Rref is not changed between the ordinary read operation, the set verify•read operation, and the reset verify•read operation. In other words, according to an embodiment of the present invention, the same reference resistor is used. As above, a combination of levels ("H" and "L") of the set reading signal SET and the reset reading signal RSET indicates the type of the operation such as the ordinary read operation, the set verify•read operation, and the reset verify•read operation. Accordingly, the additional capacitance value is changed in accordance with the logic of the read-out information through the combination of the levels of the two signals. According to this embodiment, differently from the embodiments described until now, not only the additional capacitance value of the sense node of the sense amplifier, but also the additional capacitance value of the reference node is changed.

[Electric Potential and Sense Timing in CR Discharge Read Operation]

In the above-described three types of read operation, the electric potential Vo of the sense node (sense input), the electric potential Vr of the reference node (reference input), and the sense timing (tS) can be defined as below based on Equation (3) regarding the above-described CR discharge voltage.

First, in the case of the ordinary read operation (SET=L and RSET=L), the following Equations (5-1) to (5-3) are satisfied.

$$Vo = Vpre * \exp\{-t/(Cbl * Rcell)\} \quad (5\text{-}1)$$

$$Vr = Vpre * \exp\{-t/(Cbl * Rref)\} \quad (5\text{-}2)$$

$$(tS) = Cbl * Rref \quad (5\text{-}3)$$

In the set verify•read operation (SET=H and RSET=L), the following Equations (6-1) to (6-3) are satisfied.

$$Vo = Vpre * \exp[-t/\{(Cbl + Coffset) * Rcell\}] \quad (6\text{-}1)$$

$$Vr = Vpre * \exp\{-t/(Cbl * Rref)\} = Vpre * \exp[-t/\{((Cbl + Coffset) * (Rref * Cbl)/(Cbl + Coffset))\}] \quad (6\text{-}2)$$

$$tSset = Cbl * Rref \quad (6\text{-}3)$$

In the set verify•read operation, Rref is fixed, and the resistance value of the reference resistor is decreased to {Rref*Cbl/(Cbl+Coffset)} as an equivalent value by adding Coffset. However, the voltage of the reference input is the same as that in the ordinary read operation. Accordingly, the sense timing is not different from that in the ordinary read operation.

In the reset verify•read operation (SET=L and RSET=H), the following Equations (7-1) to (7-3) are satisfied.

$$Vo = Vpre * \exp\{-t/(Cbl * Rcell)\} \quad (7\text{-}1)$$

$$Vr = Vpre * \exp[-t/\{(Cbl + Coffset) * Rref\}] = Vpre * \exp[-t/\{Cbl * (Rref * (Cbl + Coffset)/Cbl))\}] \quad (7\text{-}2)$$

$$tSreset = (Cbl + Coffset) * Rref \quad (7\text{-}3)$$

As above, in the reset verify•read operation, Rref is fixed, and the resistance value of the reference resistor is increased to {Rref*(Cbl+Coffset)/Cbl} as an equivalent value by adding Coffset. In such a case, the voltage of the reference input is changed. Accordingly, the sense timing is delayed by {(Cbl+Coffset)/Cbl} times.

According to this embodiment, as above, by switching between connections of Coffset whilst fixing the reference resistor Rref, three-value read-out operations including the ordinary read operation, the set verify•read operation, and the reset verify•read operation can be performed. In the ordinary read operation and the set verify•read operation, the reading operations can be performed at the same sense timing.

Although a component is added, switching to different capacitance values may be performed like a method in which switching to Coffset1 is performed in the set verify•read operation, and switching to Coffset2 is performed in the reset verify•read operation. In such a case, although the number of the components is increased, the degree of freedom of setting the threshold is increased.

[Electric Potential and Sense Timing in Constant-Current Discharge Read Operation]

In the above-described three types of read operation, the electric potential Vo of the sense node (sense input), the electric potential Vr of the reference node (reference input), and the sense timing tS can be defined as below based on Equation (4) regarding the above-described constant-current discharge voltage.

In the ordinary read operation (SET=L and RESET=L), when Vpre=10*VR, the following Equations (8-1) to (8-3) are satisfied.

$$Vo = Vpre - VR*t/(Cbl*Rcell) \tag{8-1}$$

$$Vr = Vpre - VR*t/(Cbl*Rref) \tag{8-2}$$

$$tS = 5*Cbl*Rref \tag{8-3}$$

In the set verify•read operation (SET=H and RESET=L), when Vpre=10*VR, the following Equations (9-1) to (9-3) are satisfied.

$$Vo = Vpre - VR*t/\{(Cbl + Coffset)*Rcell\} \tag{9-1}$$

$$Vr = Vpre - VR*t/(Cbl*Rref) = Vpre - VR*t/[\{(Cbl + Coffset)*(Rref*Cbl)/(Cbl + Coffset)\}] \tag{9-2}$$

$$tS = 5*Cbl*Rref \tag{9-3}$$

In the set verify•read operation, Rref is fixed, and the resistance value of the reference resistor is decreased to {Rref*Cbl/(Cbl+Coffset)} as an equivalent value by adding Coffset. However, the voltage of the reference input is the same as that in the ordinary read operation. Accordingly, the sense timing is not different from that in the ordinary read operation.

In the reset verify•read operation (SET=L and RESET=H), when Vpre=10*VR, the following Equations (10-1) to (10-3) are satisfied.

$$Vo = Vpre - VR*t/(Cbl*Rcell) \tag{10-1}$$

$$Vr = Vpre - VR*t/\{(Cbl + Coffset)*Rref\} = Vpre - VR*t/[Cbl*\{(Rref*(Cbl + Coffset)/Cbl)\}] \tag{10-2}$$

$$tSreset = 5*(Cbl + Coffset)*Rref \tag{10-3}$$

In the reset verify•read operation, Rref is fixed, and the resistance value of the reference resistor is increased to {Rref*(Cbl+Coffset)/Cbl} as an equivalent value by adding Coffset. In such a case, the voltage of the reference input is changed. Accordingly, the sense timing is delayed by {(Cbl+Coffset)/Cbl} times.

As above, in the CR discharge and the constant-current discharge, there is no change in that an effect of alleviating a difference between sense timings is acquired.

<8. Sixth Embodiment>

Figure 35:
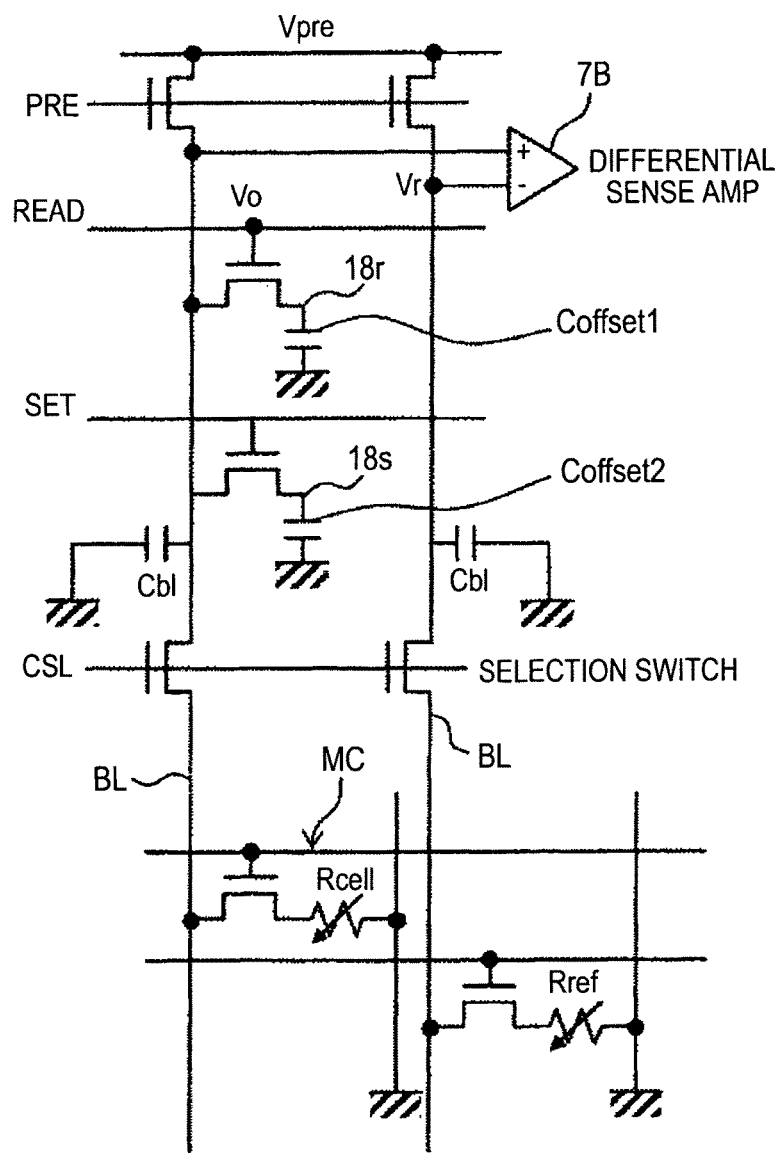
FIG. 35 is a circuit diagram showing the structure of a column connected to a pair of bit lines according to the sixth embodiment.

FIG. 35 represents the configuration of a pair of bit lines according to a sixth embodiment of the present invention. When the configuration represented in FIG. 35 is compared to the comparative example represented in FIG. 34, the reset capacitance switch 18R is omitted, and a read capacitance switch 18r is connected to the bit line BL. Here, a set capacitance switch 18S is controlled in accordance with a set reading signal SET and controls the connection of an additional capacitor Coffset2. On the other hand, the read capacitance switch 18r is controlled in accordance with a read enable signal READ and controls the connection of the additional capacitor Coffset2 to the bit line BL. The read enable signal READ is supplied from the control circuit 11 shown in FIG. 4. In this example, a case where two capacitance switches 18s and 18r are NMOS transistors is shown. However, the two capacitance switches may be PMOS transistors or transfer gates.

In the configuration shown in FIG. 35, in an ordinary read operation, the signals are controlled such that SET=L and READ=H. At this time, the read capacitance switch 18r is turned on, and the set capacitance switch 18S is turned off. Accordingly, the capacitance of the sense node input becomes (Cbl+Coffset1), and the capacitance of the reference input becomes Cbl.

In a set verify•read operation, the signals are controlled such that SET=H and READ=H. Accordingly, both the two capacitance switches 18S and 18r are turned on. Accordingly, the capacitance of the sense node input becomes (Cbl+Coffset1+Coffset2), and the capacitance of the reference input becomes Cbl.

On the other hand, in a reset verify•read operation, the signals are controlled such that SET=L and READ=L. Accordingly, the capacitance switch to be turned on is changed from that in the ordinary read operation, and both the capacitance of the sense node input and the capacitance of the reference input become Cbl. The reference resistor Rref is not changed between the ordinary read operation, the set verify•read operation, and the reset verify•read operation. In other words, according to an embodiment of the present invention, the same reference resistor is used.

[Electric Potential and Sense Timing in CR Discharge Read Operation]

Hereinafter, similarly to the fifth embodiment, the electric potential Vo of the sense node, the electric potential Vr of the reference node, and the sense timing tS at the time of three types of read operation can be defined as below based on Equation (3) regarding the above-described CR discharge voltage.

First, in the case of the ordinary read operation (SET=L and READ=H), the following Equations (11-1) to (11-3) are satisfied.

$$Vo = Vpre*\exp[-t/\{(Cbl + Coffset1)*Rcell\}] \tag{11-1}$$

$$Vr = Vpre*\exp\{-t/(Cbl*Rref)\} = Vpre*\exp[-t/\{(Cbl + Coffset1)*(Rref*Cbl/(Cbl + Coffset1))\}] \tag{11-2}$$

$$tS = Cbl*Rref \tag{11-3}$$

In the ordinary read operation, Rref is fixed, and the resistance value of the reference resistor is decreased to {Rref*Cbl/(Cbl+Coffset1)} as an equivalent value by adding Coffset1.

In the set verify•read operation (SET=H and READ=H), the following Equations (12-1) to (12-3) are satisfied.

$$Vo = Vpre*\exp[-t/\{(Cbl + Coffset1 + Coffset2)*Rcell\}] \tag{12-1}$$

$$Vr = Vpre*\exp\{-t/(Cbl*Rref)\} = Vpre*\exp[-t/\{(Cbl + Coffset1 + Coffset2)*(Rref*Cbl/(Cbl + Coffset1 + Coffset2))\}] \tag{12-2}$$

$$tSset = Cbl*Rref \tag{12-3}$$

In the set verify•read operation, Rref is fixed, and the resistance value of the reference resistor is decreased to $\{Rref*Cbl/(Cb1+Coffset1+Coffset2)\}$ as an equivalent value by adding Coffset1 and Coffset2.

In the reset verify•read operation (SET=L and READ=L), the following Equations (13-1) to (13-3) are satisfied.

$$Vo = Vpre*\exp\{-t/(Cbl*Rcell)\} \quad (13\text{-}1)$$

$$Vr = Vpre*\exp\{-t/(Cbl*Rref)\} \quad (13\text{-}2)$$

$$tSreset = Cbl*Rref \quad (13\text{-}3)$$

In this embodiment, the sense timing is not changed in the ordinary read operation, the set verify•read operation, and the reset•verify read operation.

Here, equivalent thresholds can be represented as below in the ordinary read operation, the set verify•read operation, and the reset verify operation.

In Ordinary Read Operation:
Rth=Rref*Cbl/(Cbl+Coffset1)
In Set Verify•Read Operation:
(Rth-set)=Rref*Cbl/(Cbl+Coffset1+Coffset2)
In Reset Verify•Read Operation:
(Rth-reset)=Rref Accordingly, the relationship of "(Rth-set)<Rth<(Rth-reset)" is satisfied.

[Electric Potential and Sense Timing in Constant-Current Discharge Read Operation]

In the above-described three types of read operation, the electric potential Vo of the sense node (sense input), the electric potential Vr of the reference node (reference input), and the sense timing tS can be defined as below based on Equation (4) regarding the above-described constant-current discharge voltage.

In the ordinary read operation (SET=L and READ=H), when Vpre=10*VR, the following Equations (14-1) to (14-3) are satisfied.

$$Vo = Vpre - VR*t/\{(Cbl + Coffset1)*Rcell\} \quad (14\text{-}1)$$

$$Vr = Vpre - VR*t/(Cbl*Rref) = Vpre - VR*t/\{(Cbl + Coffset1)*(Rref*Cbl/(Cbl + Coffset1))\} \quad (14\text{-}2)$$

$$tS = 5*Cbl*Rref \quad (14\text{-}3)$$

In the ordinary read operation, Rref is fixed, and the resistance value of the reference resistor is decreased to $\{Rref*Cbl/(Cbl+Coffset1)\}$ as an equivalent value by adding Coffset1.

In the set verify•read operation (SET=H and READ=H), when Vpre=10*VR, the following Equations (15-1) to (15-3) are satisfied.

$$Vo = Vpre - VR*t/\{(Cbl + Coffset1 + Coffset2)*Rcell) \quad (15\text{-}1)$$

$$Vr = Vpre - VR*t/(Cbl*Rref) = Vpre - VR*t/[(Cbl + Coffset1 + Coffset2)*\{Rref*Cbl/(Cbl + Coffset1 + Coffset2)\}] \quad (15\text{-}2)$$

$$tS = 5*Cbl*Rref \quad (15\text{-}3)$$

In the set verify•read operation, Rref is fixed, and the resistance value of the reference resistor is decreased to $\{Rref*Cbl/(Cbl+Coffset1+Coffset2)\}$ as an equivalent value by adding Coffset1 and Coffset2.

In the reset verify•read operation (SET=L and READ=L), when Vpre=10*VR, the following Equations (16-1) to (16-3) are satisfied.

$$Vo = Vpre - VR*t/(Cbl*Rcell) \quad (16\text{-}1)$$

$$Vr = Vpre - VR*t/(Cbl*Rref) \quad (16\text{-}2)$$

$$tSreset = 5*Cbl*Rref \quad (16\text{-}3)$$

The sense timing is not changed in the ordinary read operation, the set verify•read operation, and the reset•verify read operation.

Here, equivalent thresholds can be represented as below in the ordinary read operation, the set verify•read operation, and the reset verify operation.

In Ordinary Read Operation:
Rth=Rref*Cbl/(Cbl+Coffset1)
In Set Verify•Read Operation:
(Rth-set)=Rref*Cbl/(Cbl+Coffset1+Coffset2)
In Reset Verify•Read Operation:
(Rth-reset)=Rref Accordingly, the relationship of "(Rth-set)<Rth<(Rth-reset)" is satisfied. As above, in the CR discharge and the constant-current discharge, there is no change in that an effect of alleviating a difference between sense timings is acquired.

<9. Seventh Embodiment>

Figure 36:
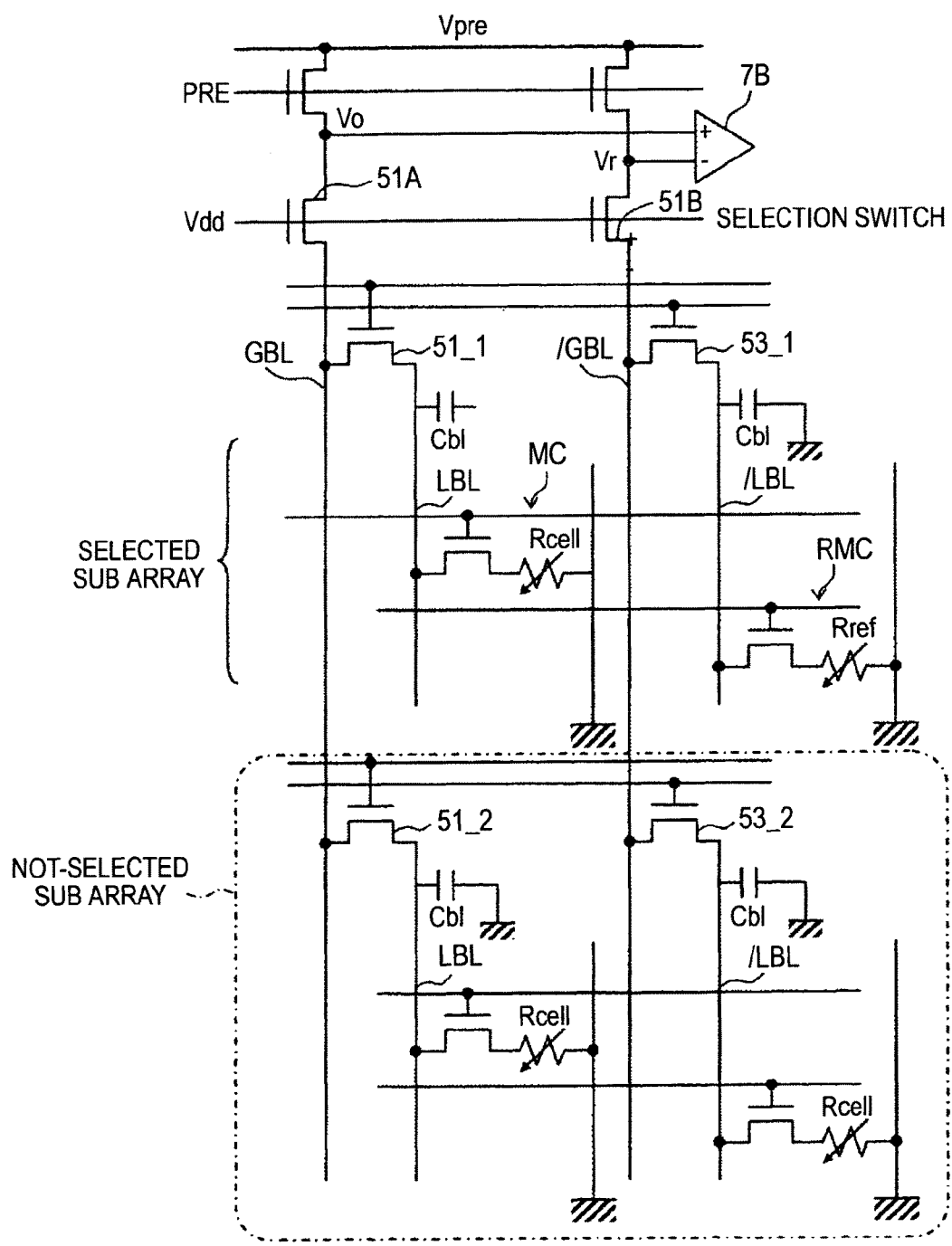
FIG. 36 is a circuit diagram showing the structure of a column connected to a pair of bit lines according to the seventh embodiment.

FIG. 36 represents the structure of a pair of bit lines according to this embodiment. This embodiment uses a bit-line layered structure, which is similar to the structures shown in FIGS. 22 to 23B, and represents an example of CR discharge from the point of operating the selection switches 51A and 51B as resistors. In addition, for a case of the constant-current discharge, the description presented below can be easily understood by analogy by referring to the description until now.

Since the bit-line layered structure has been described in detail with reference to FIGS. 22 to 23B, the description here will be primarily focused on the difference. A plurality of memory cell rows are connected to a global bit line GBL in parallel through switches, which is common to the configuration shown in FIGS. 22 to 23B. A plurality of reference memory cell rows are connected to a global complement bit line (/GBL) in parallel through switches, which is also common to the above-described configuration. Here, for convenience of the description, a cell row, which is disposed in the row direction, including a selected cell as a read target is referred to as a selected sub array, and a cell row disposed in the row direction in which all the cells are non-selected cells, which are not selected, is referred to as a non-selected sub array.

In the global bit line GBL, the number of additional capacitors Coffset is controlled in accordance with the number of local bit lines LBL that are not selected, which is similar in the configuration shown in FIGS. 23A and 23B. In this embodiment, such an operation is also performed for a global complement bit line (/GBL) that is connected to a reference node (the electric potential Vr) of a differential sense amplifier 7B. In other words, in the global complement bit line (/GBL), the additional capacitors Coffset disposed on the reference node side is adjusted in accordance with the number of connected local complement bit lines (/LBL).

When the additional capacitors Coffset are adjusted on both the above-described sides, the same advantages as those acquired from the configuration shown in FIG. 34 are acquired. On the other hand, when the additional capacitors Coffset are adjusted only on the sense node side, the same advantages as those acquired from the configuration shown in FIG. 35 can be acquired.

The above-described fourth to sixth embodiments can be used in combination with a method of switching between the reference resistors (FIGS. 24 and 25).

In the above-described six embodiments, a ReRAM has been described as an example. However, an embodiment of the present invention can be broadly applied to a variable resistance-type memory such as a phase-change memory other than the ReRAM. In addition, in a different type of a non-volatile memory such as a flash memory, there are also cases where a read operation can be performed in which word line control is not performed, in other words, the current is not constant. For example, in an MCL-NOR type, there is an example reporting such an operation. Thus, in such an operation, there are cases where there is a remarkable difference in the sense timings in accordance with the logic of the read-out information or the type (mode) of a read operation. Accordingly, it is preferable that an embodiment of the present invention is applied to a variable resistance-type memory having a wide dynamic range of a read-out current. However, the description of the embodiments presented above does not mean to exclude the application thereof to other types of non-volatile memories.

According to the first to sixth embodiments and the first modified example that have been described above, there is an advantage in that the design margin of a malfunction can be implemented easily by increasing the timing setting range of a differential amplification-type sense amplifier in the ReRAM that performs a so-called dynamic read operation.

The present application contains subject matter related to that disclosed in Japanese Priority Patent Application JP 2009-261127 filed in the Japan Patent Office on Nov. 16, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is

1. A non-volatile semiconductor memory device comprising:
   a memory component in which an electric charge discharging rate between two electrodes of the memory component varies based on a logic value of information stored in the memory component;
   a sense amplifier that detects the logic value of the information stored in the memory component by comparing a discharge electric potential of a sense node connected to a wiring to which one of the electrodes of the memory component is connected with a reference electric potential of a reference node; and
   a load capacitance changing unit that changes a load capacitance of the sense node or both the load capacitance of the sense node and a load capacitance of the reference node in accordance with the logic value of the information stored in the memory component.

2. The non-volatile semiconductor memory device according to claim 1, wherein the load capacitance changing unit can switch the load capacitance of the sense node among a plurality of values.

3. The non-volatile semiconductor memory device according to claim 2,
   wherein the sense amplifier is a differential sense amplifier that amplifies a difference between an electric potential of the sense node and an electric potential of the reference node,
   wherein any of a plurality of reference resistors is connected to the reference node as being selectable through a corresponding switch that is controlled in accordance with the logic value of the read-out information, and
   wherein the load capacitance changing unit changes a value of the load capacitance of the sense node in accordance with a value of the reference resistor that is connected to the reference node.

4. The non-volatile semiconductor memory device according to claim 3, further comprising a plurality of memory components, wherein the load capacitance changing unit is configured to change the value of the load capacitance of the sense node by changing a number of wirings that connect in common a plurality of the memory components to the sense node.

5. The non-volatile semiconductor memory device according to claim 4, further comprising a memory cell array in which memory cells each configured by connecting a cell switch and one of the plurality of memory components in series are disposed in a matrix pattern,
   wherein the memory cell array includes a plurality of bit lines connecting the memory cells to the sense node and has a bit-line layered structure in which each of the plurality of bit lines is connected to a corresponding plurality of sub-bit lines through sub-bit line selection switches, where each of the plurality of sub-bit lines is connected to a corresponding plurality of the memory cells, and
   wherein the load capacitance changing unit changes the value of the load capacitance of the sense node by controlling the sub-bit line selection switches in accordance with the logic level of the read-out information.

6. The non-volatile semiconductor memory device according to claim 5, wherein each of the plurality of bit-lines is connected to the sense node through a connection switch that controls a connection between the bit line and the sense node.

7. The non-volatile semiconductor memory device according to claim 6, wherein the bit-line connection switch of each of the plurality of bit-lines is a transistor that operates in a linear region.

8. The non-volatile semiconductor memory device according to claim 6, wherein the bit-line connection switch of each of the plurality of bit-lines is a transistor that operates in a saturation region.

9. The non-volatile semiconductor memory device according to claim 5, wherein the memory component is a variable resistance-type memory device in which a logic value of information stored therein varies based on a direction of an applied voltage.

10. The non-volatile semiconductor memory device according to claim 2,
    wherein the sense amplifier is a sense amplifier that performs amplification by comparing the electric potential of the sense node with a constant electric potential of the reference node,
    wherein the load capacitance changing unit includes a plurality of additional load capacitors and a plurality of switches that each selectively connect a corresponding one of the plurality of additional load capacitors to the sense node, and
    wherein the load capacitance changing unit is configured to change the value of the load capacitance of the sense node in accordance with the logic value of the read-out information by controlling the plurality of switches.

11. The non-volatile semiconductor memory device according to claim 10, further comprising a plurality of memory components,
    wherein the load capacitance changing unit is configured to change the value of the load capacitance of the sense node by changing a number of wirings that connect in common the plurality of the memory components to the sense node.

12. The non-volatile semiconductor memory device according to claim 11, further comprising a memory cell array in which memory cells each configured by connecting a cell switch and one of the plurality of memory components in series are disposed in a matrix pattern,
  wherein the memory cell array includes a plurality of bit lines connecting the memory cells to the sense node and has a bit-line layered structure in which each of the plurality of bit lines is connected to a corresponding plurality of sub-bit lines through sub-bit line selection switches, where each of the plurality of sub-bit lines is connected to a corresponding plurality of the memory cells, and
  wherein the load capacitance changing unit changes the value of the load capacitance of the sense node by controlling the sub-bit line selection switches in accordance with the logic value of the read-out information.

13. The non-volatile semiconductor memory device according to claim 12, wherein each of the plurality of bit-lines is connected to the sense node through a bit-line connection switch that controls a connection between the bit line and the sense node.

14. The non-volatile semiconductor memory device according to claim 13, wherein the bit-line connection switch of each of the plurality of bit-lines is a transistor that operates in a linear region.

15. The non-volatile semiconductor memory device according to claim 13, wherein the bit-line connection switch of each of the plurality of bit-lines is a transistor that operates in a saturation region.

16. The non-volatile semiconductor memory device according to claim 13, wherein an NMOS switch is connected between the bit-line connection switch of each of the plurality of bit-lines and the sense node, and
  wherein, by applying a clamp voltage to a gate of the NMOS switch, each of the plurality of the bit lines is clamped at a voltage that is acquired by lowering the clamp voltage by a voltage between the gate and a source of the MOS transistor so as to separate a load of the sense node at which a voltage amplitude is generated in accordance with a sense operation and a load of the respective bit lines from each other.

17. The non-volatile semiconductor memory device according to claim 12, wherein the memory component is a variable resistance-type memory device in which a logic value of information stored therein varies based on a direction of an applied voltage.

18. The non-volatile semiconductor memory device according to claim 1, wherein the memory component is a variable resistance-type memory device in which a logic value of information stored therein varies based on a direction of an applied voltage.

* * * * *

UNITED STATES PATENT AND TRADEMARK OFFICE
CERTIFICATE OF CORRECTION

| | | |
|---|---|---|
| PATENT NO. | : 8,482,950 B2 | Page 1 of 1 |
| APPLICATION NO. | : 12/926118 | |
| DATED | : July 9, 2013 | |
| INVENTOR(S) | : Makoto Kitagawa et al. | |

It is certified that error appears in the above-identified patent and that said Letters Patent is hereby corrected as shown below:

On the Title Page

FOREIGN PATENT DOCUMENTS section

"JP 2005-51005 4/2005" should read -- JP 2005-510005 4/2005 --.

Signed and Sealed this
Twenty-ninth Day of October, 2013

Teresa Stanek Rea
*Deputy Director of the United States Patent and Trademark Office*